(12) United States Patent
Kumar Goel et al.

(10) Patent No.: US 9,568,536 B2
(45) Date of Patent: Feb. 14, 2017

(54) TRANSITION DELAY DETECTOR FOR INTERCONNECT TEST

(71) Applicants: IMEC, Leuven (BE); Taiwan Semiconductor Manufacturing Company, Ltd., HsinChu (TW)

(72) Inventors: Sandeep Kumar Goel, HsinChu (TW); Erik Jan Marinissen, Leuven (BE)

(73) Assignees: IMEC, Leuven (BE); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 14/059,366

(22) Filed: Oct. 21, 2013

(65) Prior Publication Data

US 2014/0111243 A1 Apr. 24, 2014

(30) Foreign Application Priority Data

Oct. 19, 2012 (EP) ..................................... 12189267

(51) Int. Cl.
*G01R 31/26* (2014.01)
*G01R 31/3185* (2006.01)
*G01R 31/317* (2006.01)

(52) U.S. Cl.
CPC ..... *G01R 31/2601* (2013.01); *G01R 31/31725* (2013.01); *G01R 31/318513* (2013.01);
(Continued)

(58) Field of Classification Search
CPC .......... G05F 1/466; H01L 22/14; H01L 22/32; H01L 2224/16225; H01L 2924/15311; G01R 31/31725; G01R 31/2812; G01R 31/2815; G01R 31/2831; G01R 31/2884; G01R 31/31712; G01R 31/31717; G01R 31/318538; G01R 31/318572; G01R 31/2601; G01R 31/318513; G01R 31/3185; G01R 31/318511; G11C 2029/0405; G11C 2029/3602; G11C 29/003; G11C 29/1201; G11C 29/12015
(Continued)

(56) References Cited

U.S. PATENT DOCUMENTS 5,268,639 A * 12/1993 Gasbarro ......... G01R 31/31937
714/736
7,673,203 B2 * 3/2010 Park et al. .................... 714/726
(Continued)

FOREIGN PATENT DOCUMENTS

EP 0358371 B1 * 3/1998 .............. G06F 11/26
EP 2302403 A1 3/2011
(Continued)

OTHER PUBLICATIONS

Shu-Min Li K et al., IEEE Standard 1500 Compatible Oscillation Ring Test Methodology for Interconnect Delay and Crosstalk Detection, 2007, Springer Science + Business Media, LLC., Journal of Electronic Testing: Theory and Applications 23, 341-355.*
(Continued)

*Primary Examiner* — Jermele M Hollington
*Assistant Examiner* — Khristopher Yodichkas
(74) *Attorney, Agent, or Firm* — Knobbe, Martens, Olson & Bear LLP

(57) ABSTRACT

A test circuitry is configured to test for transition delay defects in a first inter-die interconnect connecting a first die and a second die. A test data value is initially received and temporarily stored in a data storage element. The test data is subsequently looped between the storage element and the second die through a feedback loop including the first inter-die interconnect and a second inter-die interconnect. A data conditioner conditions the test data value received from
(Continued)

the second die so as to make it distinguishable from the test data value sent to the second die. A clock pulse generator generates a delayed clock pulse. A selection logic applies the generated delayed clock pulse and the conditioned fed back test data value to the data storage element. A readout unit for reading out a test data value stored in the data storage element.

17 Claims, 17 Drawing Sheets

(52) U.S. Cl.
CPC ............... *H01L 2224/16225* (2013.01); *H01L 2924/15311* (2013.01)

(58) Field of Classification Search
USPC .............................................. 324/762, 762.02
See application file for complete search history.

(56) References Cited

U.S. PATENT DOCUMENTS

| | | | | |
|---|---|---|---|---|
| 7,793,179 | B2* | 9/2010 | Sul | ................................ 714/726 |
| 2006/0095221 | A1* | 5/2006 | Salmi | ............... G01R 31/31922 702/106 |
| 2006/0117232 | A1 | 6/2006 | Warren, Jr. et al. | |
| 2006/0174298 | A1* | 8/2006 | Chen | ...................... H04N 7/163 725/100 |
| 2007/0280012 | A1* | 12/2007 | Obayashi et al. | ............ 365/200 |
| 2008/0086665 | A1 | 4/2008 | Takei et al. | |
| 2009/0113264 | A1 | 4/2009 | Seibold et al. | |
| 2010/0213965 | A1 | 8/2010 | Chen | |
| 2010/0332177 | A1* | 12/2010 | Wu et al. | ....................... 702/117 |
| 2011/0102011 | A1 | 5/2011 | Van der Plas et al. | |
| 2011/0298488 | A1 | 12/2011 | Stillman et al. | |
| 2011/0316572 | A1 | 12/2011 | Rahman | |
| 2012/0012841 | A1 | 1/2012 | Chang et al. | |
| 2012/0025846 | A1* | 2/2012 | Minas et al. | ................... 324/606 |
| 2012/0110402 | A1* | 5/2012 | Wang et al. | .................... 714/729 |
| 2012/0138927 | A1* | 6/2012 | Kang | ............. G01R 31/318513 257/48 |

FOREIGN PATENT DOCUMENTS

| | | | | |
|---|---|---|---|---|
| EP | | 2372379 A1 * | 10/2011 | ......... G01R 31/3185 |
| EP | | 2413150 A1 * | 2/2012 | ............. G01R 31/28 |
| WO | WO 2011/117418 A1 * | | 9/2011 | ......... G01R 31/3185 |

OTHER PUBLICATIONS

Allsup, et al., "Advances in 3D-IC Testing", EE Times-Asia, 2011, pp. 1-6.
Extended European Search Report for European Application 12189267.3 dated Mar. 25, 2013.
Yi, et al., "Interconnect Delay Fault Test on Boards and SoCs with Multiple Clock Domains", ETRI Journal, vol. 30, No. 3, Jun. 2008, pp. 403-411.
Lewis, et al., "Testing Circuit-Partitioned 3D IC Designs", In IEEE Computer Society Annual Symposium on VLSI, Tampa, FL, May 2009, in 6 pages.

* cited by examiner

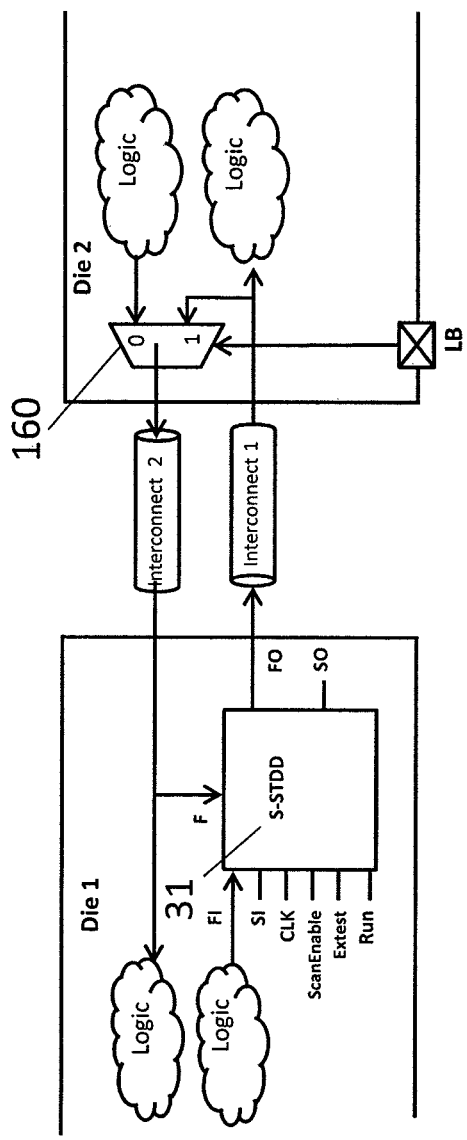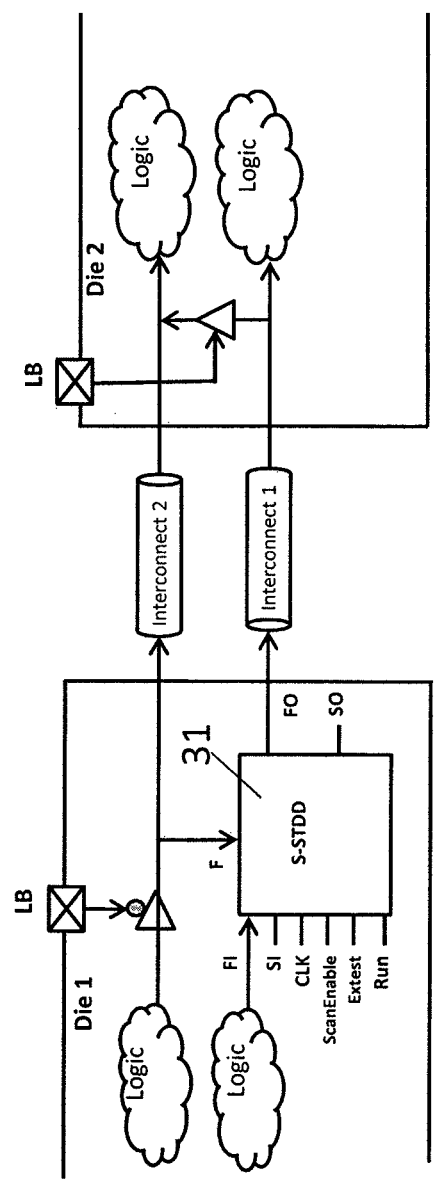
FIG. 16(a)
FIG. 16(b)

TRANSITION DELAY DETECTOR FOR INTERCONNECT TEST

CROSS-REFERENCE TO RELATED APPLICATIONS

This application claims foreign priority to European patent application EP 12189267.3 filed on Oct. 19, 2012, the contents of which is incorporated by reference herein in its entirety.

BACKGROUND OF THE INVENTION

Field of the Invention

The disclosed technology relates generally to interconnecting semiconductor chips, e.g. three-dimensional stacking of semiconductor chips and interconnecting two dimensional chips and, in particular, to testing for defects in the interconnects between the chips.

Description of the Related Technology

The semiconductor industry continues to try to integrate more functionality into a smaller form factor, increase performance, lower power and/or reduced cost. Traditionally, the industry's approaches to achieving these goals were often limited to two-dimensional approaches, including, for example, conventional scaling of CMOS, integrating multiple IP cores in a single die (System-on-Chip, SoC), integrating multiple dies in a single package (Multi-Chip Package, MCP) and integrating multiple ICs on a printed Circuit Board (PCB). More recently, the industry's approaches have included three-dimensional implementations, including, for example, integrating System-in-Package (SiP), in which multiple naked dies are vertically stacked in a single IC package and interconnected by wire-bonding to the substrate, and integrating Package-on-Package (PoP), in which multiple packaged chips are vertically stacked.

Three-dimensional (3D) stacking of chips is a hot research item, as it promises higher transistor densities and smaller footprints of electronic products. The latest evolution in this list of innovations is the so-called three-dimensional stacked IC (3D-SIC); a single package containing a vertical stack of naked dies which are interconnected by means of inter-die interconnections, optionally including through-substrate-vias (TSVs). 3D stacking based on inter-die interconnections offers the benefits of more functionality, higher bandwidth and performance at smaller sizes, alongside lower power consumption and cost; and this even in an era in which conventional feature-size scaling becomes increasingly difficult and expensive.

Currently, a lot of research and development work is done around three-dimensional stacking of integrated circuits. Two popular set-ups are illustrated in FIG. 1 (a) and FIG. 1(b). FIG. 1(a) illustrates an interposer-based 3D die stack in which multiple active dies are placed side-by-side on top of and interconnected through an interposer, such as a semiconductor, e.g. silicon, interposer. FIG. 1(b) illustrates a full 3D-SIC, in which multiple active dies are placed on top of one another.

The inter-die interconnections in such stacked ICs typically have high density, high performance, and low power dissipation. In face-to-face bonding, they are typically implemented by means of micro-bumps, e.g. Cu and CuSn micro-bumps. In face-to-back bonding, these interconnects also might contain through-substrate vias (TSVs).

Semiconductor manufacturing processes are defect-prone and hence all ICs need to be tested for manufacturing defects. Stacked ICs are no exception to this. Hence also these new inter-die connected 3D-SICs need to be tested for manufacturing defects, in order to guarantee sufficient outgoing product quality to a customer. Chip stacks should be delivered fault free as much as possible. In 3D chip stacking, the inter-die interconnections carry all interconnect signals between two dies, and hence are quite critical for functional operation of the chip. Both the inter-die interconnection manufacturing process, as well as the bonding process are delicate, and hence the inter-die interconnects are prone to defects, such as for example opens, shorts, and delay defects.

For stacked 3D-SICs, different test phases may be distinguished: (1) pre-bond test, (2) mid-post test (=testing of partial stacks), (3) post-bond test (=testing of complete stacks), and (4) final, packaged test. There are many reasons why a SIC test should be a modular test, in which the various interconnect layers, dies and perhaps embedded cores within the dies are tested as stand-alone units:

Heterogeneous stacks (combining logic, memory and analog circuitry) have different defect mechanisms, fault models, test patterns, and test pattern generation tools;

Different dies might come from different companies, who are not willing to share the implementation details of their die with others (IP protection);

The test flow involves different test phases, each with its own focus and test content. These flows are typically not fixed either, but evolve over the production life time, for example when die yields mature or yield excursions occur. Modular testing supports adaptive test flows, where tests can flexibly be included or excluded or re-ordered.

A 3D test access architecture that supports modular testing has been described in EP2372379. This architecture is based on the addition of a test wrapper around each die of the stack. The wrapper provides controllability and observability at all I/Os of the die. The wrapper supports a Serial and optionally a Parallel Test Access Mechanism (TAM) which can be flexibly configured to provide test access to one or multiple dies of the SIC simultaneously. Per die, testing the die's internal circuitry, testing the die's interconnects and a bypass mode are supported.

Common static fault models for interconnects are hard opens and shorts. They can be tested with a static (DC) test. The test access for static tests is provided by the wrappers in the 3D test access architecture described above. Dedicated test pattern generation tools are available for generating the appropriate test patterns.

However, inter-die interconnects can also exhibit delay defects, due to which the interconnect signal is transferred, but not within the specified delay margins. Testing for such delay defects can be problematic. The inter-die interconnect is very fast. Depending on the implementation (micro-bump to micro-bump, TSV to micro-bump to micro-bump, etc.) the fault-free propagation delay over the interconnect might vary from 50 ps to 500 ps (corresponding to signal transfer frequencies of 2 GHz to 20 GHz). Catching ultra-fast delay defects would involve complex timing synchronization between the two dies, whereas these dies might come from different, independent design teams (or even different companies) who do not necessarily know each other's timings. Thus, there is a need for circuitry and methods of testing for such delay defects which do not involve complex timing synchronization.

SUMMARY OF CERTAIN INVENTIVE ASPECTS

Some embodiments enable testing for delay defects on inter-die interconnections without using hard-to-implement synchronization between multiple dies. It is an advantage of some embodiments that very fast functional clocks are not required.

The above objective can be accomplished by a method and device as disclosed herein.

In a first aspect, a test circuitry configured to test for transition delay defects in inter-die interconnects is disclosed, where the test circuitry is configured to test a structure comprising a first die and a second die electrically connected to one another by at least a first inter-die interconnect. The test circuitry comprises an input port configured to receive a test data value and a data storage element configured to temporarily store the test data value. The test circuitry additionally comprises a second inter-die interconnect configured to be electrically connected to a first inter-die interconnect so as to form a feedback loop for transferring the test data value from the data storage element back to the data storage element. The test circuitry additionally comprises a data conditioner configured to condition the fed back test data value so as to make it distinguishable from the stored test data value. The test circuitry additionally comprises a clock pulse generator configured to generate a delayed clock pulse. The test circuitry additionally comprises a selection logic configured to apply the generated delayed clock pulse and the conditioned fed back test data value to the data storage element. The test circuitry further comprises readout means for reading out a test data value stored in the data storage element.

It is an advantage of test circuitry according to some embodiments that it provides a simple way to determine whether transition delay defects such as rise delay defects or fall delay defects occur. This determination is done by the readout means. In one implementation, when the readout means reads out, after a transition has occurred at the input port of the test circuitry, the same value as before the transition, a transition delay defect is determined to occur. When the readout means reads out, after a transition has occurred at the input port of the test circuitry, a different value than before the transition, it is determined that no transition delay defect occurs. In alternative embodiments, inverted values could lead to these determinations. Hence, in such embodiments, when the readout means reads out, after a transition has occurred at the input port of the test circuitry, a same value than before the transition, it is determined that no delay defects occur, and when the readout means reads out, after a transition has occurred at the input port of the test circuitry, a different value than before the transition, it is determined that a delay defect occurs.

It is an advantage of some embodiments that timing signals may be implemented on a single die only, and that synchronization between dies is not required. It is an advantage of some embodiments that all externally applied signals are operated in a non-timing-critical way, despite the fact that the interconnects and their associated delay faults which are desired to be detected can be ultra-fast. This is all absorbed by the self-timed aspect of some embodiments, and depends on careful sizing of the on-chip clock pulse generator for generating a delayed clock pulse.

In test circuitry according to some embodiments, the clock pulse generator may comprise a delay element for delaying an equivalent of the test data value sent through the feedback loop, e.g. the test data value itself or an inverted version of the test data value, for generating the delayed clock pulse.

In test circuitry according to some embodiments, the clock pulse generator may be arranged such that the delayed clock pulse has a delay larger than an expected functional, i.e. considered fault-free, delay of the test data signal when travelling through the feedback loop. The expected functional delay may for example be obtained from simulation, and may include an anticipated variation on ideal functional delay values. The expected functional delay may be a delay equal to the maximum allowed/acceptable fault-free delay.

In test circuitry according to some embodiments, the clock pulse generator may be implemented with a delay element having a fixed delay. Alternatively, the clock pulse generator may be implemented with a delay element having a programmable, hence user-definable or user-settable, delay.

In test circuitry according to some embodiments, the selection logic may comprise a multiplexer for controlling the data storage so that alternative inputs are offered to its data input. The alternative inputs offered at the data input may either be the externally applied test data signal or this test data signal after having travelled through the feedback loop.

In test circuitry according to some embodiments, the selection logic may comprise a multiplexer for controlling the data storage so that alternative inputs are offered to its clock input. The alternative inputs offered at the clock input may either be an externally or internally generated clock signal or the delayed clock pulse.

In accordance with some embodiments, the test circuitry may be combined with existing design-for-test (DfT) elements, such as a 3D die wrapper cell. In this case, the area costs for the test circuitry are minimized, as the existing wrapper cell may be largely reused.

Test circuitry according to some embodiments may be arranged for determining only a rise-transition delay defect, a fall-transition delay defect, or both.

In test circuitry according to some embodiments, the data storage element may comprise a flip-flop. The test circuitry can consist of simple digital logic; it can be implemented with standard-cell library elements, and it can be turned into a library element itself.

In test circuitry according to some embodiments, the further inter-die interconnect may be a functional interconnect. Alternatively, the further inter-die interconnect may be a test-only interconnect.

In a second aspect, a structure is disclosed, which comprises a first die and a second die electrically connected to one another by at least a first inter-die interconnect, where at least one of the first die and the second die comprises first electrical circuit and a test circuitry configured to test transition delay defects in the at least one inter-die interconnect. The test circuitry comprises an input port for receiving a test data value. The test circuitry additionally comprises a data storage element configured to temporarily store the test data value. The test circuitry additionally comprises a second inter-die interconnect configured to be electrically connected to the first inter-die interconnect so as to form a feedback loop for transferring the test data value from the data storage element back to the data storage element. The test circuitry additionally comprises a data conditioner configured to condition the fed back test data value so as to make it distinguishable from the stored test data value. The test circuitry additionally comprises a clock pulse generator configured to generate a delayed clock pulse. The test circuitry additionally comprises a selection logic for applying the generated delayed clock pulse and the conditioned fed back test data value to the data storage element. The test circuitry further comprises readout means for reading out a test data value stored in the data storage element.

At least the first die and the second die may be stacked on top of one another in a 3D chip configuration. Alternatively, the first die and the second die may be placed adjacent one another, and the interconnection between both dies may go via a third die, e.g. an interposer.

In a third aspect, a method of testing is disclosed, for testing transition delay defects in inter-die interconnects in a structure comprising a first die and a second die electrically connected to one another by at least a first inter-die interconnect. The method comprises receiving a test data value and temporarily storing the test data value in a data storage element. The method additionally comprises transmitting the test data value from the first die over a feedback loop comprising the first inter-die interconnect and a second inter-die interconnect back to the first die. The method additionally comprises conditioning the fed back test data value so that it is distinguishable from the received test data value and feeding it to the data storage element. The method further comprises determining whether after a pre-determined delay the test data value or the conditioned test data value is stored in the data storage element, and therefrom deciding whether a transition delay defect occurred.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 14 shows a R-STDD (Receiving Self-Timed Delay Detector), i.e., a case in which the test circuitry is located on the receiving side of an already existing, functional interconnect under test. This is to exemplify that the test circuitry can be in either of the two dies around the interconnect.

FIGS. 16(a)-16(b) illustrates a plurality of stacked dies with functional inter-die interconnects, where a functional inter-die interconnect is re-used for forming the feedback loop of the test circuitry according to some embodiments.

Figure 1B:
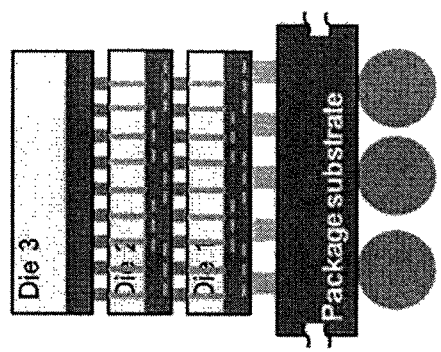
FIG. 1 (a) illustrates an interposer-based 3D SIC and FIG. 1(b) illustrates a 3D SIC.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope. In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the context of the present invention, delay defects are defects where signals are transferred, but not within specified delay margins. A transition delay defect is a defect where a transition signal (e.g. transition from high to low, such as logical 1 to logical 0, or a transition from low to high, such as logical 0 to logical 1) is delayed more than specified delay margins. A rise transition defect is the same as a transition delay defect for a transition from low to high. A fall delay defect is a transition delay defect for a transition from high to low.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 1A:
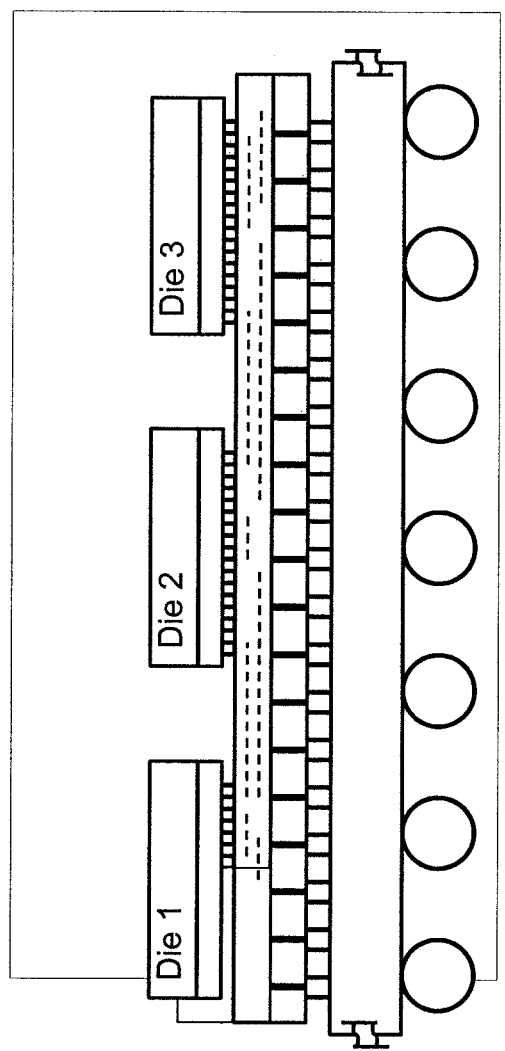

A 3D die stack comprises two or more chips (integrated circuits) stacked vertically so that they occupy less space and/or have a larger connectivity, as for example illustrated in FIG. 1(b). In particular stacks, an interposer may be used as an electrical interface between die towers each comprising at least one die, for electrically interconnecting the die towers by at least functional wires in the interposer. An example of such stack is illustrated in FIG. 1(a). In the context of the present invention, a functional wire is a wire, e.g. a metal interconnect, which is part of the functional design of stack, and which is not dedicatedly added for test purposes.

In the following, a test access mechanism (TAM) provides the means for on-chip test data transport. Test wrappers form an interface between a die and its environment, and connect the terminals of the die to other dies and to the TAM.

Figure 2:
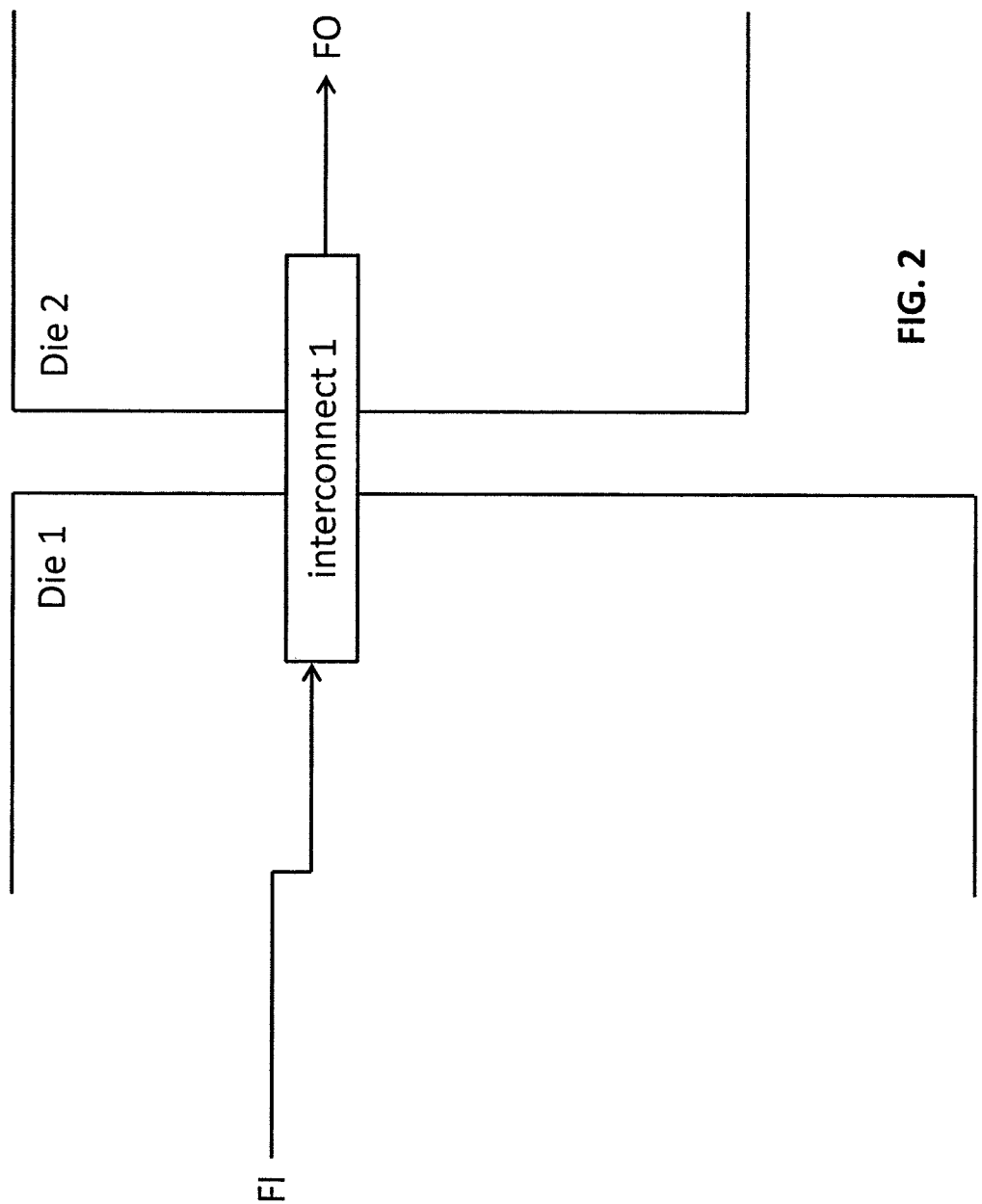
FIG. 2 schematically illustrates two prior art stacked and interconnected dies.

Some embodiments relate to a system and method for testing delay defects in inter-die interconnects, for example, but not limited thereto, in a 3D chip stack. FIG. 2 illustrates (part of) such 3D chip stack, comprising at least a first die DIE1 for example a bottom die, and a second die DIE2, for example a top die, connected to one another by means of a functional wire interconnect 1, which is an inter-die interconnect (interconnection between circuitry—not illustrated—on two different dies).

Figure 3:
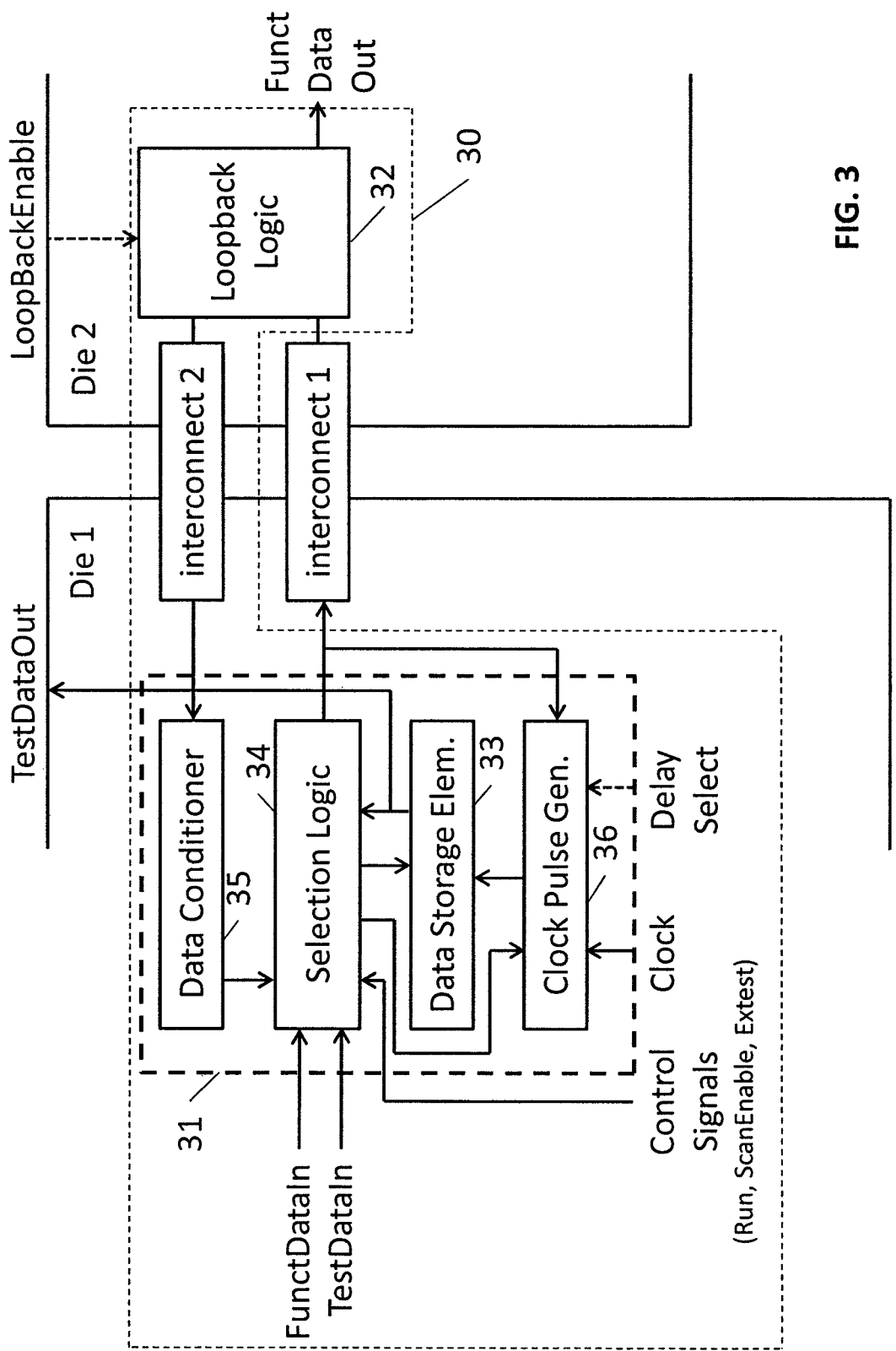
FIG. 3 is a high-level block diagram of test circuitry according to some embodiments, for transition defect detection.

FIG. 3 illustrates the 3D chip stack of FIG. 2(a), provided with test circuitry 30 in accordance with some embodiments, for testing for delay defects in inter-die interconnects interconnect 1.

The test circuitry 30 comprises a detector unit 31 and at least one further inter-die interconnect interconnect 2 arranged for being electrically connected to the first inter-die interconnect interconnect 1 so as to from a feedback loop from the detector unit 31 back to the detector unit 31. In the embodiment illustrated in FIG. 3, the arrangement for forming the feedback loop comprises loopback logic 32. Loopback logic 32 may for example comprise a switch, coupled between the first interconnect interconnect 1 and the further interconnect interconnect 2, thus at least part of the time forming the feedback loop.

The detector unit 31 comprises a data storage element 33 for temporarily storing a test data value. The detector unit furthermore comprises selection logic 34 for selecting, based on selection control signals, whether an interconnect test should be performed, and if so, which data should be routed to the second die, and which signals should be routed to the data storage element 33. Furthermore, a data conditioner 35 is provided, for conditioning data received back from the second die Die 2 via the feedback loop, so as to be able to clearly distinguish it from the data transmitted to the second die Die 2. A clock pulse generator 36 is provided for providing a delay on test data before feeding it back to the data storage element.

High-level operation processes are set out below. It will be appreciated in the embodiments described below, all externally-applied control signals (such as Extest, ScanEnable, DelaySelect, LoopBack, Run, SI, SO) are advantageously configured to be non-timing-critical.

In a first process, the test of the inter-die interconnects is initialized. Hereto, the control signals (ScanEnable, Extest, LoopBackEnable, Run) are switched on (e.g. set high). The Extest control signal indicates that the testing of the inter-die interconnects should be started, while the ScanEnable control signal sets the selection logic 34 such that test data is routed to the data storage element 33. A first value of a test signal is read into the system, to set all data values at a pre-determined value.

In a second process, test data TestDataIn is loaded, and in view of the setting of the selection logic 34, is stored into the data storage element 33. If the first value of the test signal (during initialization) was low, e.g. logical 0, then the test data may now be high, e.g. logical 1, to determine whether a rising-transition defect is present. Alternatively, if the first value of the test signal was high, e.g. logical 1, then the test data may now be low, e.g. logical 0, to determine whether a falling-transition defect is present. An external clock generates a clock signal which, via the clock pulse generator 36 is fed to the data storage element 33.

In a third process, loop back data is sent out, to the selection logic 34, for being transferred to the feedback loop in a next process. A clock pulse is sent out to the clock pulse generator 36, and optionally, if the delay is programmable, a delay is selected by setting an appropriate delay select signal. A programmable delay can for example be used for defect-size diagnosis.

In a fourth process, the loop back data is transferred through the feedback loop, and arrives back at the detector unit 31. More particularly, the loop back data goes via the data conditioner 35, where it is appropriately conditioned so as to clearly see a difference between the original signal and the conditioned signal. In particular embodiments, the data conditioning may comprise or consist of inverting the loopback data. The conditioned, e.g. inverted, signal travels to the selection logic 34, ready to accept it.

In a fifth process, the delayed clock pulse arrives at the data storage element 33 and captures the arrived conditioned, e.g. inverted; loopback data.

In a sixth process, the captured conditioned, e.g. inverted, data signal is read out from a pin of the first die Die1.

In a fault-free operation, the loop back data is received at the data storage element 33 before the delayed clock pulse arrives there, hence when the delayed clock pulse arrives, the data storage element 33 is ready to capture the loopback data and make it available to an appropriate output pin of the first die Die1 for being read out.

In a faulty operation, i.e. when the electrical inter-die interconnection interconnect 1 is insufficiently fast, hence is exhibiting a delay defect, indicating a defect in the inter-die interconnect interconnect 1 or somewhere in the loop back path, the loop back data is not yet received at the data storage element 33 when the delayed clock pulse arrives there. Hence, upon reception of the delayed clock pulse, the data storage element 33 captures the old (non-conditioned, e.g. non-inverted) value still present at the data storage element 33, and this non-conditioned data signal is read out.

Figure 4:
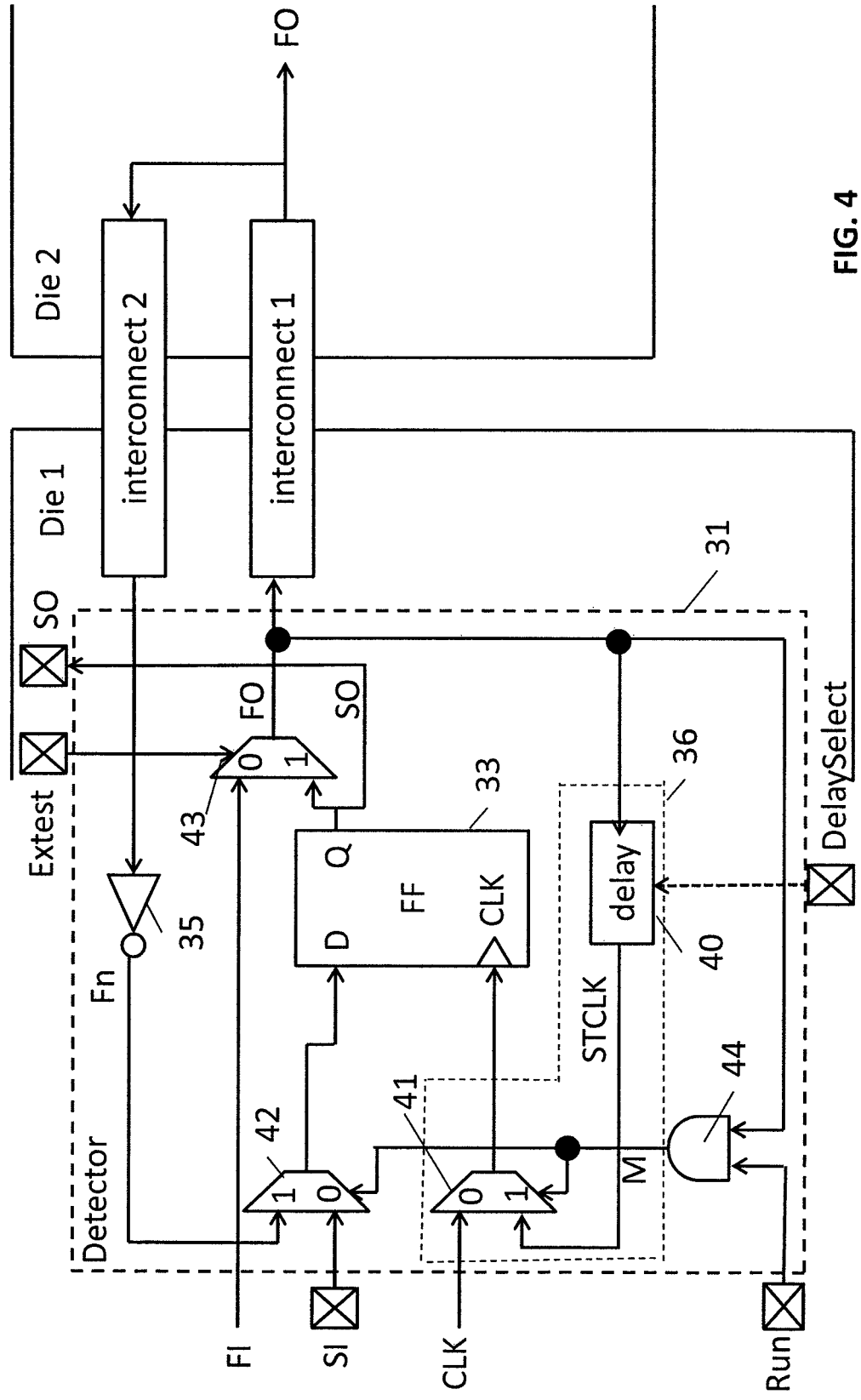
FIG. 4 illustrates a test circuitry for rise transition defect detection according an embodiment.

FIG. 4 schematically illustrates an implementation of test circuitry according to some embodiments. In the implementation illustrated, the data storage element 33 is a flip-flop. The clock pulse generator 36 is formed by a delay element 40, e.g. a delay line, and a first multiplexer 41. The delay element 40 is arranged for receiving the signal sent to the feedback loop, and for generating a clock signal once a pre-determined delay, either a fixed delay or a programmable or selectable delay, has elapsed. The pre-determined delay should be selected such that a time elapses during which, in fault-free operation, the test signals sent over the feedback loop are expected to be received back by the data storage element 33, e.g. flip-flop. In the embodiment illustrated, the selection logic 34 is formed by a second multiplexer 42, a third multiplexer 43 and an AND-gate 44. The data conditioner 35 is formed by an inverter.

The operation of this circuit has been described above, but is repeated here explicitly for determination of a rise defect.

First, the system is initialised.

During the initialization phase, a low external control signal (logical 0) is applied to the RUN pin of the first die Die1. For determining a rise defect, i.e. a defect when a signal transitions from low to high, first the test is initialized with a low test data value, e.g. logical 0. Independent of the value of the second input to the AND gate 44, as during initialization the RUN signal is low, a low control signal, e.g. logical 0, is generated for controlling the first multiplexer 41 and the second multiplexer 42. The second multiplexer 42 is controlled so as to provide the test data applied to the pin SI, in case of determination of a rise defect a low signal, e.g. logical 0, to the data port D of the flip-flop 33, and the first multiplexer 41 is controlled so as to provide an external clock signal CLK to the clock port CLK of the flip-flop 33. When the clock signal arrives at the clock port CLK of the flip-flop 33, the data present at its data port D is transferred to its output port Q. In the example of testing for a rise defect, the test data loaded consists of a low value, logical 0. Hence this low value is transferred to the output port Q of the flip-flop 33.

The loopback functionality is enabled. In the embodiment illustrated in FIG. 4, as the second interconnect interconnect 2 is a dedicated test-only interconnect, the feedback loop is always closed, and no separate LoopBackEnable signal is required. The third multiplexer 43 is controlled by control signal Extest so as to allow the test data at the output port of the flip-flop 33 to be transferred to the feedback loop formed by the first interconnect interconnect 1, the further interconnect interconnect 2 and the conductive path between them. This way, the test data gets back to the test circuitry 31. If, on the other hand, the value of Extest is low, e.g. logical 0, then functional data is transferred from the first die Die 1 to the second die Die 2.

The test signal fed back over the feedback loop, is received by the data conditioner, in the embodiment illustrated an inverter 35 where the data signal is inverted. Hence the test signal which had a low value, e.g. was a logical 0, now becomes a high value, e.g. logical 1. This logical 1 is fed to a second input of the second multiplexer 42, the first input thereof being the port for loading the external test data, coupled to pin SI.

At the same time of transmitting the test data to the feedback loop, the test data is also sent to the clock pulse generator 36, more particularly to the delay element 40 thereof. After a pre-determined delay as set out above with respect to the high-level description, a test clock signal STCLK is generated, which is fed to a second input of the first multiplexer 41, the first input being dedicated for receiving the functional or test clock signal CLK.

Also at the same time of transmitting the test data to the feedback loop, the test data is also sent to the AND gate 44. In the embodiment illustrated, the signal sent to the AND gate 44 is a logical 0, hence the output of the AND gate 44 is a logical 0. This latter logical 0 is fed as a control signal to the first multiplexer 41 and to the second multiplexer 42, thus allowing these to transmit the external test signal and the external clock signal to the flip-flop 33.

Once the circuit is initialized (later half of the clock cycle), RUN is set to a high signal, e.g. logical 1, to start the phase of Load-n-Run. In a second process, test data is loaded into the system. For determining a rise defect, the low test signal, e.g. logical 0, is replaced by a high test signal, e.g. logical 1 at the signal pin SI. The control signal generated by the AND gate 44 still being 0, this high test signal, e.g. logical 1, is clocked into flip-flop 33, and is brought to its output port Q.

As a delay check is being performed, Extest has a high value, e.g. logical 1, and the third multiplexer 43 is allowed to pass the signal from the output port Q of the flip-flop 33, i.e. a high value, e.g. logical 1, towards the first interconnect interconnect 1. At the same time, this high value, e.g. logical 1, is routed towards the input of the delay element 40 and towards the second port of the AND gate 44.

The loopback functionality being enabled, the test signal, e.g. logical 1, is transmitted from the first interconnect interconnect 1 over the further interconnect interconnect 2, back to the test circuitry 31, more particularly to the input of the inverter 35 thereof. The test signal is inverted, i.e. the high signal becomes a low signal, e.g. logical 1 becomes logical 0, and this low signal, e.g. logical 0, is applied to a second port of the second multiplexer 42.

In the meantime, the high signal, e.g. logical 1, which was also transferred to the delay element, has given rise to the generation of an internal clock signal STCLK, fed to a second input port of the first multiplexer 41.

The output of the third multiplexer 43 being a high value, e.g. logical 1, and also being fed to the second input port of the AND gate 44, this AND gate 44 now receives at its input ports twice a high value, e.g. logical 1. Hence the output signal it generates also has a high value, e.g. logical 1, thus triggering the first multiplexer 41 and the second multiplexer 42 to feed the internally generated clock signal STCLK and the fed back inverted test signal, respectively, to the clock port CLK and the input port D of the flip-flop 33.

Depending on the difference in delay generated by the transmission of the test signal over the feedback loop and generated by the delay element 40, either one of the test signal or the clock signal may arrive first at the flip-flop 33. If the inverted test signal arrives first, this inverted signal may be clocked to the output port Q of the flip-flop 33 and may be read out, indicating no delay error occurs in the inter-die interconnect. If, on the other hand, the clock signal arrives first, the old non-inverted test signal may again be clocked to the output port Q of the flip-flop 33 and may be read out, thus indicating a delay error (as twice a low value, e.g. logical 0, may be read out one after the other, while a rise signal, e.g. logical 1, has been applied).

Figure 5:
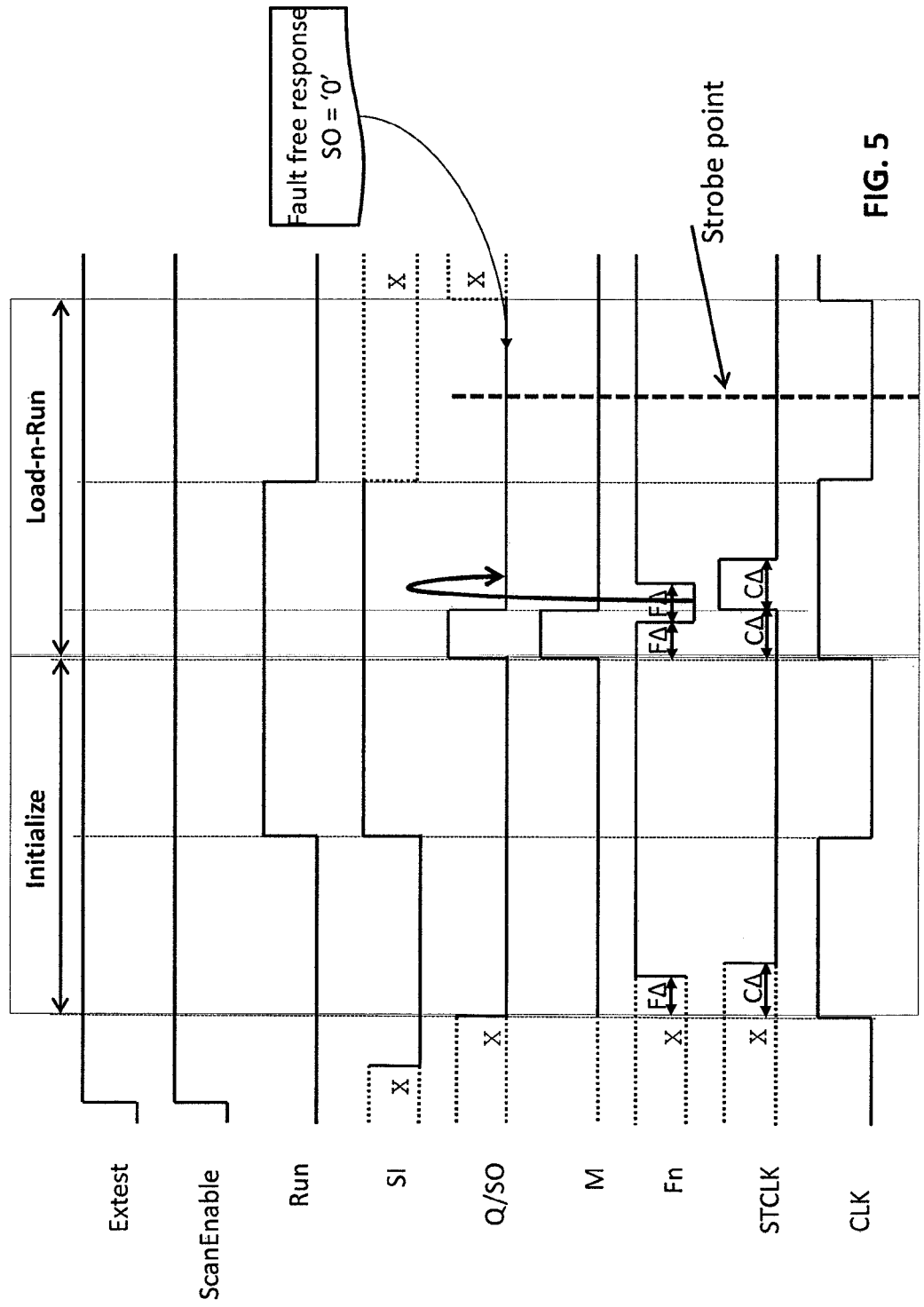
FIG. 5 is a timing diagram of the embodiment of FIG. 4 in fault-free operation.
Figure 6:
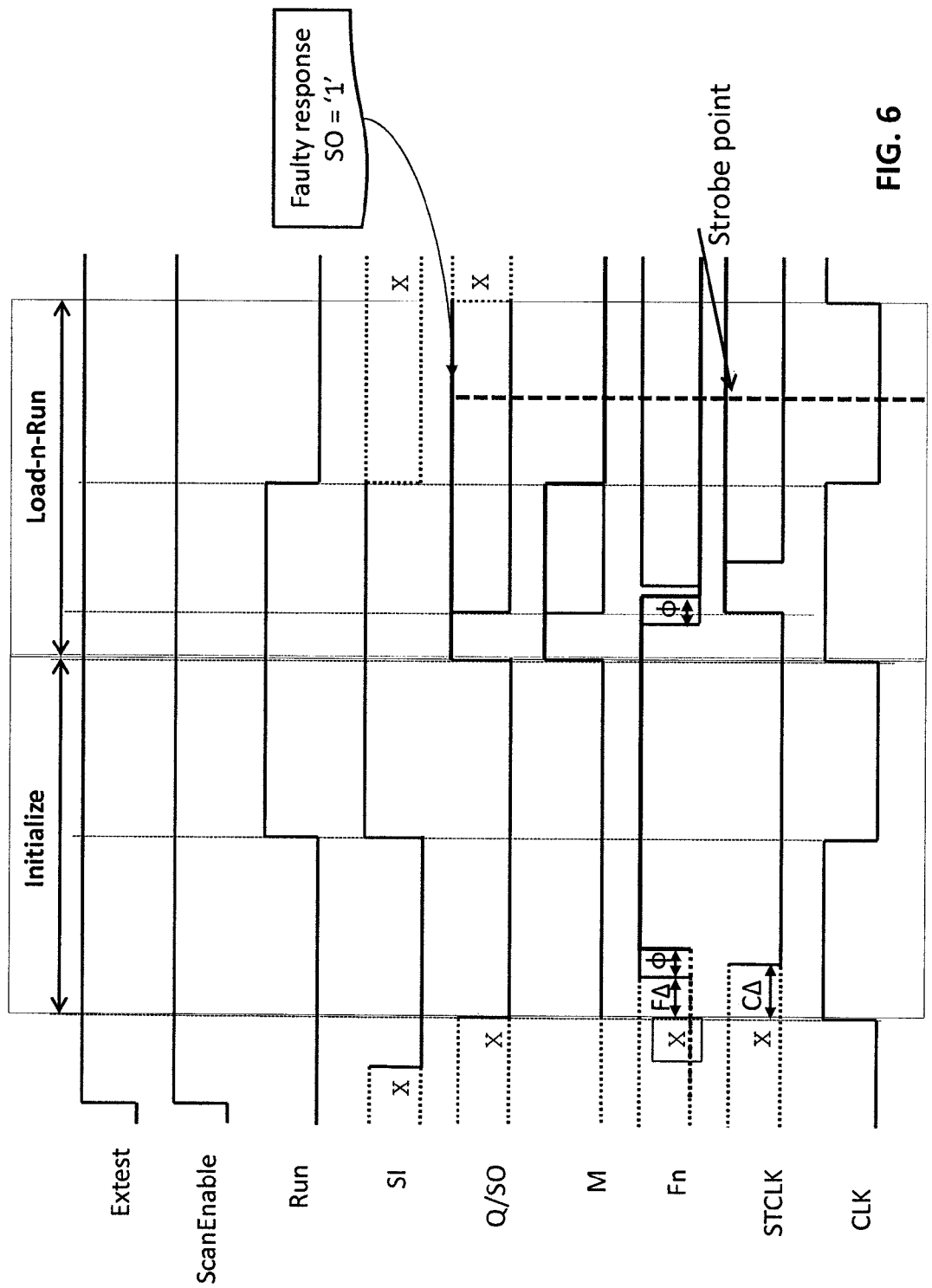
FIG. 6 is a timing diagram of the embodiment of FIG. 4 in faulty operation.

A timing diagram of such rise defect testing in case of fault-free operation is illustrated in FIG. 5, while the case of a faulty operation is illustrated in FIG. 6. It can be seen that the "normal" delay at the inverter 35, which is the delay generated by the inter-die interconnect, is $F\Delta$, while the "normal" delay generated by the delay element is $C\Delta$. The delay at the delay element is selected to be larger than the "normal" delay to be expected from the inter-die interconnect (when the inter-die interconnect is fault-free). From FIG. 6 it can be seen that, in case of a faulty operation, on top of the "normal" delay $F\Delta$, the inter-die interconnect also provides a supplementary delay $\Phi$, such that the total delay $F\Delta+\Phi$ by the inter-die interconnect is larger than the pre-set delay $C\Delta$ of the delay element.

The timing diagrams illustrate that first the signals Extest and ScanEnable are enabled. Then two subsequent CLK clock cycles take place: (1) initialize and (2) Load-n-Run. In the initialize cycle, in the embodiment illustrated, a "0" value is scanned into the flip-flop. Also, the Run control signal is asserted. In the Load-n-Run cycle, a "1" value is scanned into the flip-flop. This 0→1 rise transition at the flip-flop's output causes the following subsequent self-timed actions within the same clock cycle:

(1) Multiplexer control signal M is asserted, due to which the alternative inputs of the two multiplexers are selected;

(2) The inverted feedback loop Fn arrives at the flip-flop's data input;

(3) This value Fn is clocked into the flip-flop when the delayed clock signal STCLK arrives at the flip-flop. This makes the flip-flop content switch from "1" to "0".

In case interconnect 1 and interconnect 2 suffer from a delay defect larger than $C\Delta-F\Delta$, the inverted feedback loop Fn arrives too late, and the flip-flop stays at "1". In this way, a discrimination can be made between the fault-free and the faulty case.

It is an advantage of some embodiments that all externally applied signals for testing (such as ScanEnable, Extest, DelaySelect, LoopBackEnable, Run, SI, SO) are not timing-critical, despite the very fast nature of inter-die interconnects and their delay defects.

Figure 7:
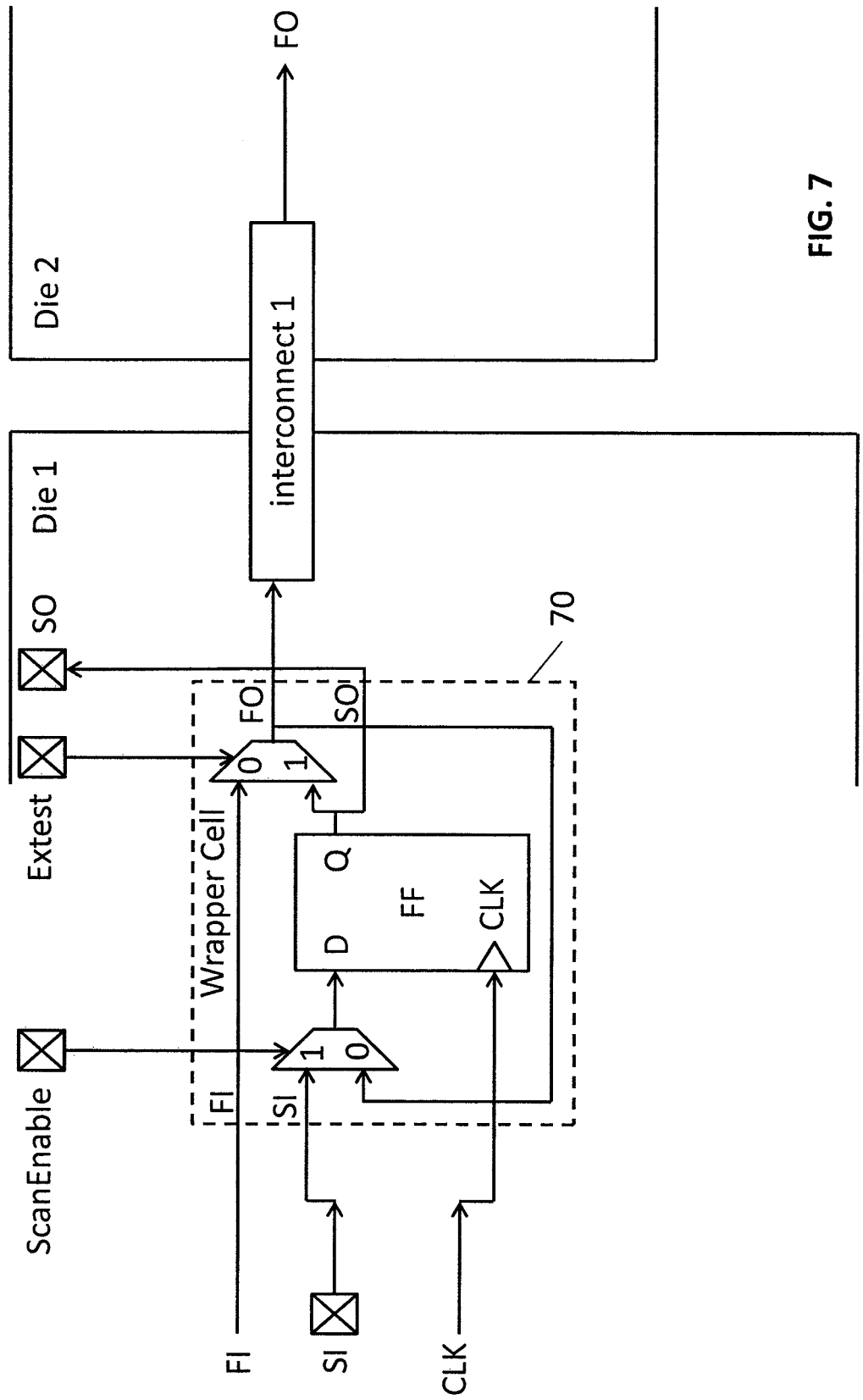
FIG. 7 schematically illustrates two prior art stacked and interconnected dies, of which one is provided with a wrapper cell for testing.
Figure 8:
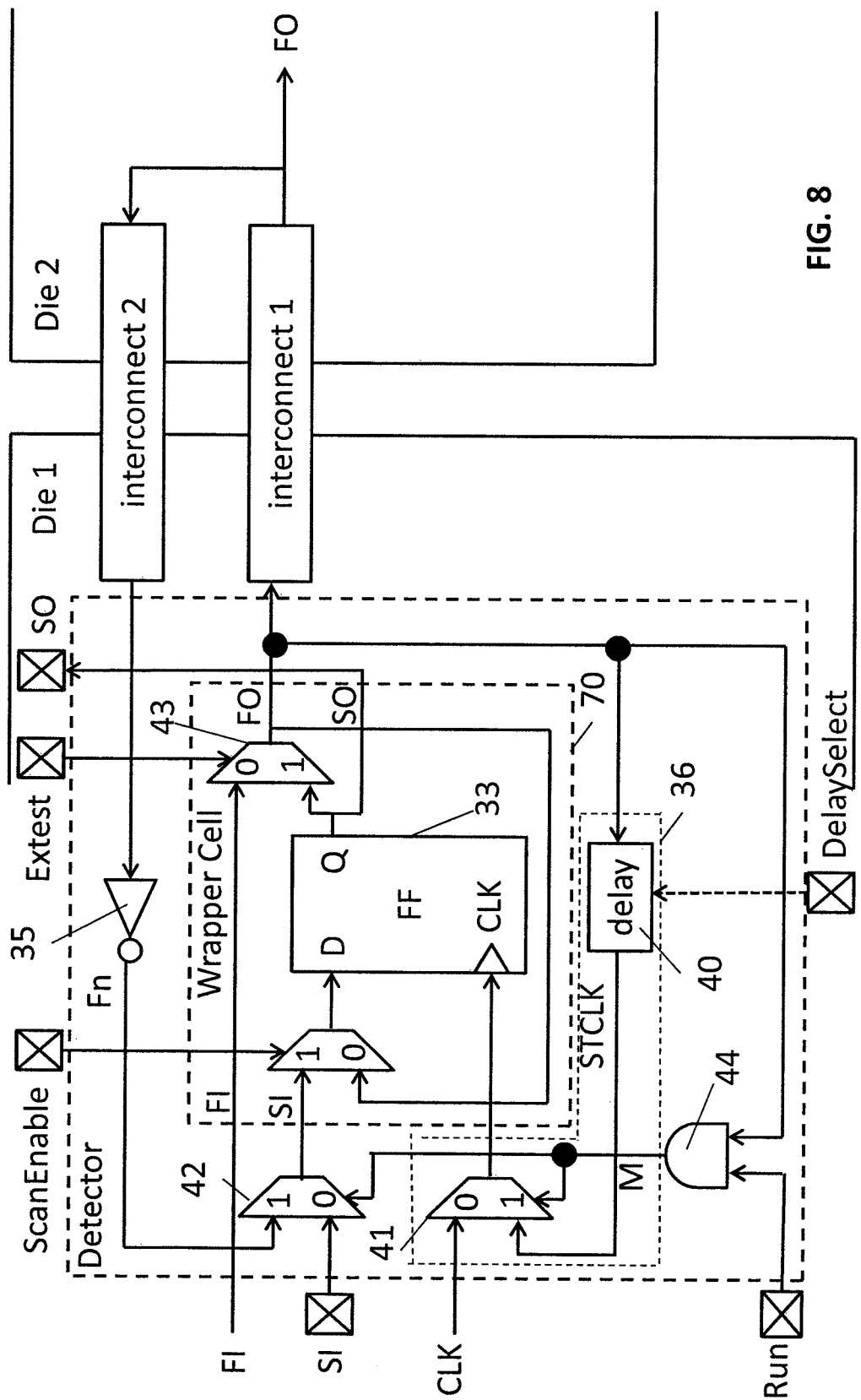
FIG. 8 illustrates a test circuitry for rise-transition defect detection according to an embodiment.

In particular embodiments, the original circuit may already contain a wrapper cell 70 for testing purposes, as illustrated in FIG. 7. Such wrapper cell 70 may comprise elements like a flip-flop and multiplexers, and these elements may be re-used in test circuitry for a delay test as in accordance with some embodiments. An example of such test circuitry reusing elements of a wrapper cell 70 is illustrated in FIG. 8.

In the embodiment illustrated, the wrapper cell 70 already contains a flip-flop and two multiplexers, one before the input of the flip-flop for multiplexing between an externally applied test signal fed to pin SI of the first die Die 1 and between a fed back signal; and one at the output of the flip-flop, for multiplexing between a functional signal (applied when not being in test mode) and a test signal emanating from the flip-flop (when being in test mode).

In accordance with some embodiments, the test circuitry for testing for delay errors comprises a data storage element, which in the present embodiment is the flip-flop 33 which is reused from the wrapper cell 70. A clock pulse generator circuit 36 is added, comprising a delay element 40 and a multiplexer 41 for multiplexing between an external clock signal and an internally generated clock signal. Selection logic is provided, comprising a multiplexer 42 for multiplexing between an externally applied test data signal and a fed back data signal, a multiplexer 43 for selecting between a functional data signal and a test data signal being transmitted from the first die Die 1 to the second die Die 2, and an AND gate 44 for generating control signals for controlling the multiplexers 41 and 42. In the embodiment illustrated, the multiplexer 43 for selecting between a functional data signal and a test data signal being transmitted from the first die Die 1 to the second die Die 2 is re-used from the wrapper cell 70. Furthermore, a data conditioner unit adapted for generating a signal representative of the fed back test signal, but clearly distinguishable therefrom, for example an inverter 35, is also added.

The circuits illustrated up to now and described above are all intended for determining a rise delay. In alternative embodiments, circuits are provided for determining a fall delay.

Figure 9:
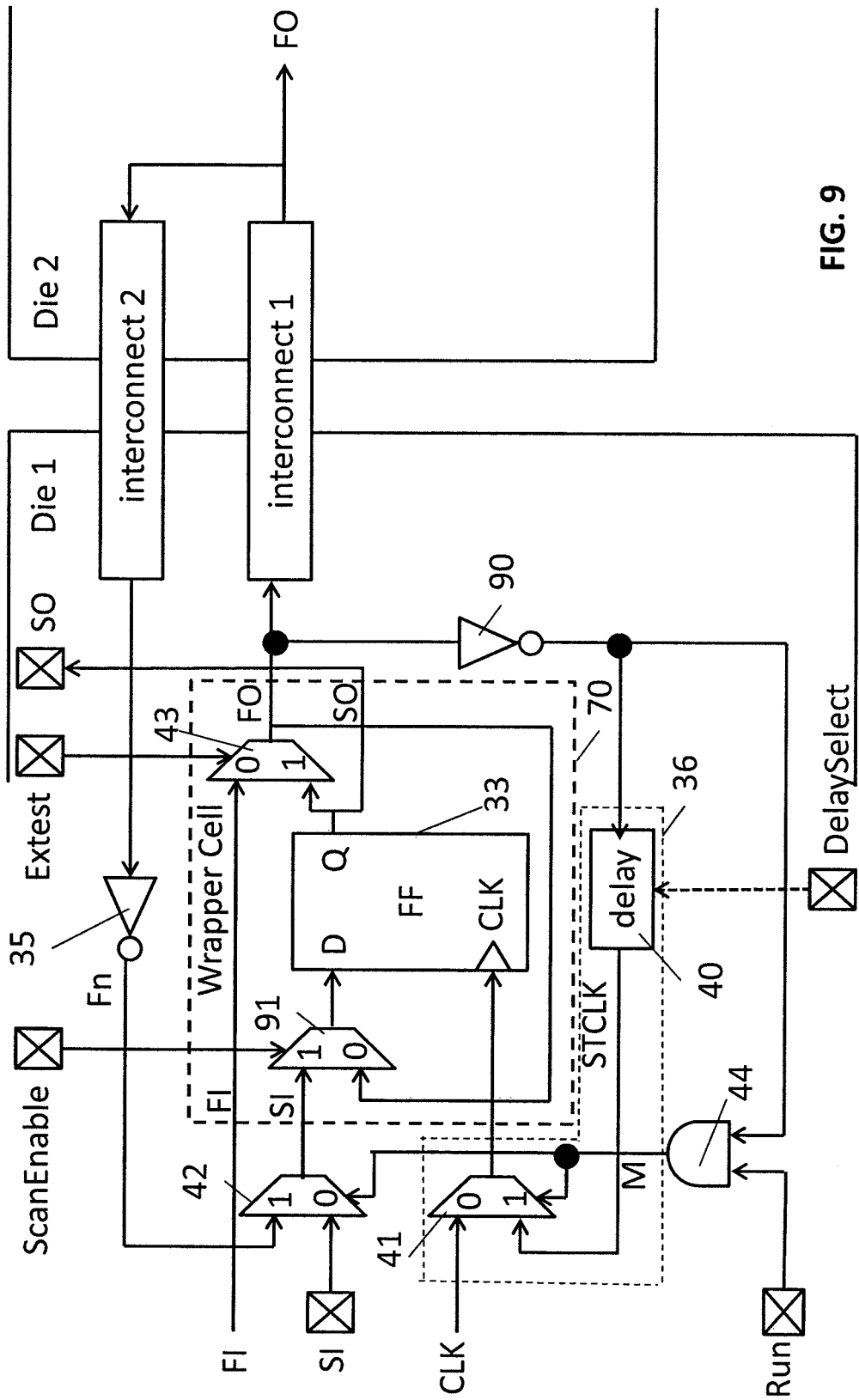
FIG. 9 illustrates a test circuitry for fall-transition defect detection according to an embodiment.

A first embodiment thereof is illustrated in FIG. 9. This embodiment re-uses elements of a wrapper cell 70, although the invention is not limited thereto and embodiments of the invention are also applicable without reusing the wrapper cell. Again the test circuitry for testing a delay error, in particular a fall delay, comprises a data storage element 33 for temporarily storing a test data value. The detector unit furthermore comprises selection logic for selecting, based on selection control signals, whether an interconnect test should be performed, and if so, which data should be routed to the second die Die 2, and which signals should be routed to the data storage element 33. Furthermore, a data conditioner 35 is provided, for example an inverter, for conditioning data received back from the second die Die 2 via the feedback loop, so as to be able to clearly distinguish it from the data transmitted to the second die Die 2. A clock pulse generator 36 is provided for providing a delay on test data before feeding it back to the data storage element 33. Loopback logic (not explicitly illustrated in FIG. 9, but shown as a closed feedback circuit) is provided in the second die Die 2 for electrically interconnecting the first interconnect interconnect 1 and the further interconnect interconnect 2, thus forming a closed loop, at least partially inside Die 2, going from the first die Die 1, over the first interconnect interconnect 1, via the further interconnect interconnect 2, back to the first die Die 1. Furthermore, another inverter 90 is provided, for locally inverting the signal applied to the first interconnect interconnect 1 before applying it to the clock generator 36 and to the AND gate 44. In alternative embodiments (not illustrated), instead of using a single inverter 90, two inverters could be used, one in the path to the delay element, and one in the path to the AND gate.

The operation if this circuit for determining a fall defect is described herein below, with reference to the system illustrated in FIG. 9.

First, the system is initialised.

During the initialization phase, a low external control signal (logical 0) is applied to the RUN pin of the first die Die1.

For determining a fall defect, i.e. a defect when a signal transitions from high to low, e.g. logical 1 to logical 0, first the test is initialized with a high test data value, e.g. logical 1. Independent of the value of the second input to the AND gate 44, as during initialization the RUN signal is low is low, a low control signal, e.g. logical 0, is generated for controlling the first multiplexer 41 and the second multiplexer 42. The second multiplexer 42 is controlled so as to provide the test data applied to the pin SI, in case of determination of a rise defect a high signal, e.g. logical 1, to a multiplexer 91 of the wrapper cell 70. The multiplexer 91 is controlled by a ScanEnable signal, allowing the high signal, e.g. logical 1, emanating from the SI pin to be transferred to the data input port D of the flip-flop 33. The first multiplexer 41 is controlled by the control signal from the AND gate 44 so as to provide an external clock signal CLK to the clock port CLK of the flip-flop 33. When the clock signal arrives at the clock port CLK of the flip-flop 33, the data present at its data port D is transferred to its output port Q. In the example of testing for a fall defect, the initialization test data loaded consists of a high value, e.g. logical 1. Hence this high value is transferred to the output port Q of the flip-flop 33.

As, in the embodiment illustrated, the second interconnect interconnect 2 is a dedicated test-only interconnect, the loopback functionality is always enabled. The third multiplexer 43 is controlled by control signal Extest so as to allow the test data at the output port of the flip-flop 33 to be transferred to the feedback loop formed by the first interconnect interconnect 1, the further interconnect interconnect 2 and the conductive path between them. This way, the test data gets back to the first die Die 1. If, on the other hand, the value of Extest is low, e.g. logical 0, then functional data is transferred from the first die Die 1 to the second die Die 2.

The test signal fed back over the feedback loop, is received by the data conditioner, in the embodiment illustrated an inverter 35 where the data signal is inverted. Hence the test signal which had a high value, e.g. was a logical 1, now becomes a low value, e.g. logical 0. This logical 0 is fed to a second input of the second multiplexer 42, the first input thereof being the port for loading the external test data, coupled to pin SI.

At the same time of transmitting the test data to the feedback loop, the test data is also sent, in the embodiment illustrated, to inverter 90, where the signal with high value, e.g. logical 1, becomes a signal with low value, e.g. logical 0.

This inverted signal, logical 0, is provided to the clock pulse generator 36, more particularly to the delay element 40 thereof. After a pre-determined delay determined by the delay element 40, a falling edge STCLK is generated, which is fed to a second input of the first multiplexer 41, the first input being dedicated for receiving the external clock signal CLK.

At the same time of transmitting the inverted test data to the clock pulse generator 36, the inverted test data is also sent to the AND gate 44. In the embodiment illustrated, the signal sent to the AND gate 44 is a logical 0, hence the output of the AND gate 44 remains a logical 0. This latter logical 0 is fed as a control signal to the first multiplexer 41 and to the second multiplexer 42, thus allowing these to transmit the external test signal and the external clock signal to the flip-flop 33.

Once the circuit is initialized (later half of the clock cycle), RUN is set to a high signal, e.g. logical 1, to start the phase of Load-n-Run. In a second process, test data is loaded into the system. For determining a fall defect, the high test signal, e.g. logical 1, is replaced by a low test signal, e.g. logical 0, at the signal pin SI. The control signal generated by the AND gate 44 still being 0, this low test signal, e.g. logical 0, is passed onto the multiplexer 91 from where it is transferred to the data input port 3 of the flip-flop 33, is clocked into flip-flop 33, and is brought to its output port Q.

As a delay check is being performed, Extest still has a high value, e.g. logical 1, and the third multiplexer 43 is allowed to pass the signal from the output port Q of the flip-flop 33, i.e. a low value, e.g. logical 0, towards the first interconnect interconnect 1. At the same time, this low value, e.g. logical 0, is routed towards the inverter 90, where it is transformed into a high value, e.g. logical 1, which is applied to the input of the delay element 40 and towards the second port of the AND gate 44.

The loopback functionality being enabled, the test signal, e.g. logical 0, is transmitted from the first interconnect interconnect 1 over the further interconnect interconnect 2, back to the first die Die 1, more particularly to the input of the inverter 35 thereof. The test signal is inverted, i.e. the low signal becomes a high signal, e.g. logical 0 becomes logical 1, and this high signal, e.g. logical 1, is applied to a second port of the second multiplexer 42.

In the meantime, the high signal, e.g. logical 1, obtained from the second inverter 90, which was transferred to the delay element 40, has given rise to the generation of an internal clock signal STCLK, fed to a second input port of the first multiplexer 41.

The high signal, e.g. logical 1, obtained from the second inverter 90, also being fed to the second input port of the NAND gate 44, this NAND gate 44 now receives at its input ports twice a high value, e.g. logical 1. Hence the output signal it generates also has a high value, e.g. logical 1, thus triggering the first multiplexer 41 and the second multiplexer 42 to feed the internally generated clock signal STCLK and the fed back inverted test signal, respectively, to the clock port CLK and the input port D of the flip-flop 33.

Depending on the difference in delay generated by the transmission of the test signal over the feedback loop and generated by the delay element 40, either one of the test signal or the clock signal may arrive first at the flip-flop 33. If the inverted test signal arrives first, this inverted signal may be clocked to the output port Q of the flip-flop 33 and may be read out, indicating no delay error occurs in the inter-die interconnect. If, on the other hand, the clock signal arrives first, the old non-inverted test signal may again be clocked to the output port Q of the flip-flop 33 and may be read out, thus indicating a delay error.

Figure 10:
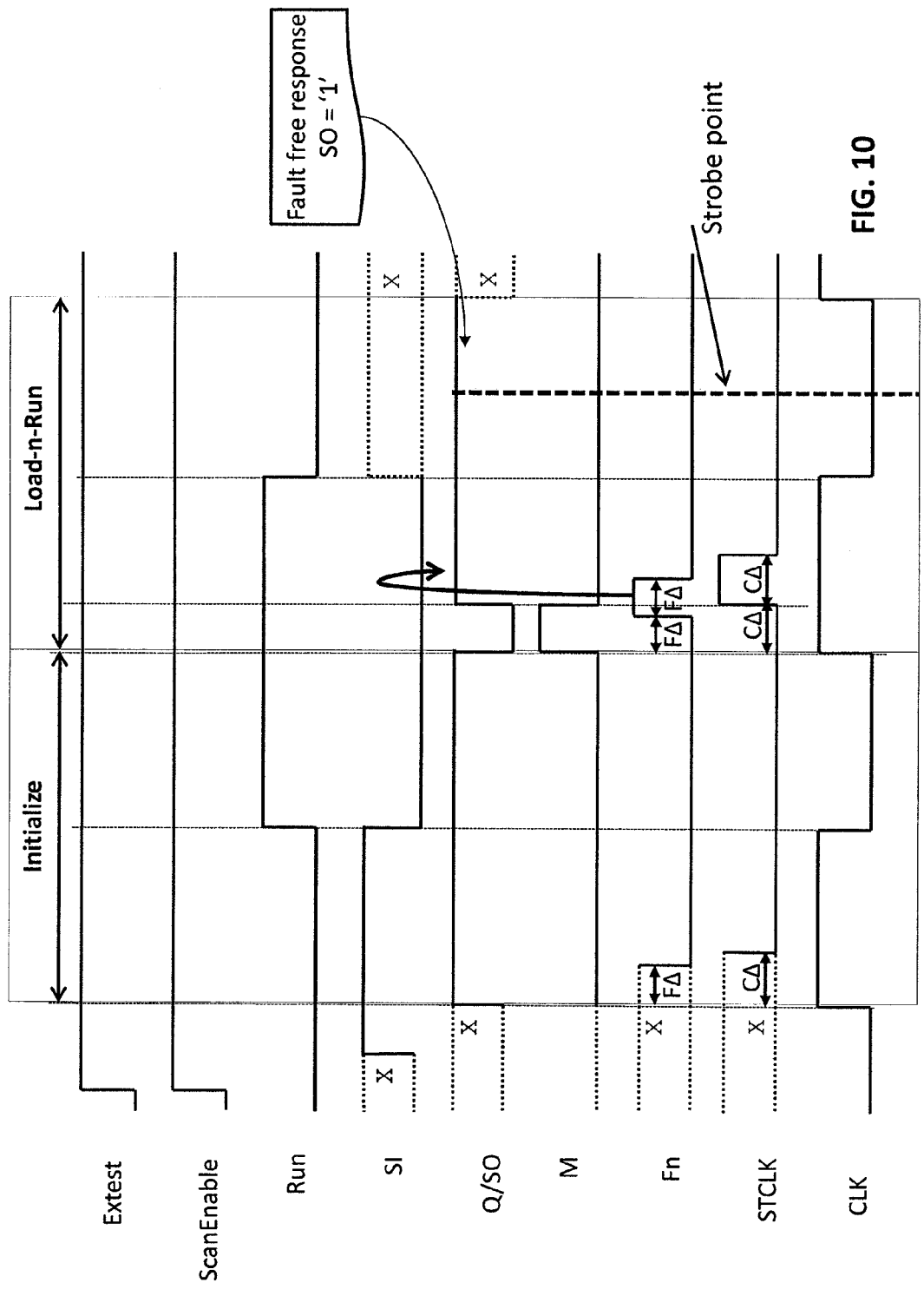
FIG. 10 is a timing diagram of the embodiment of FIG. 9 in fault-free operation.
Figure 11:
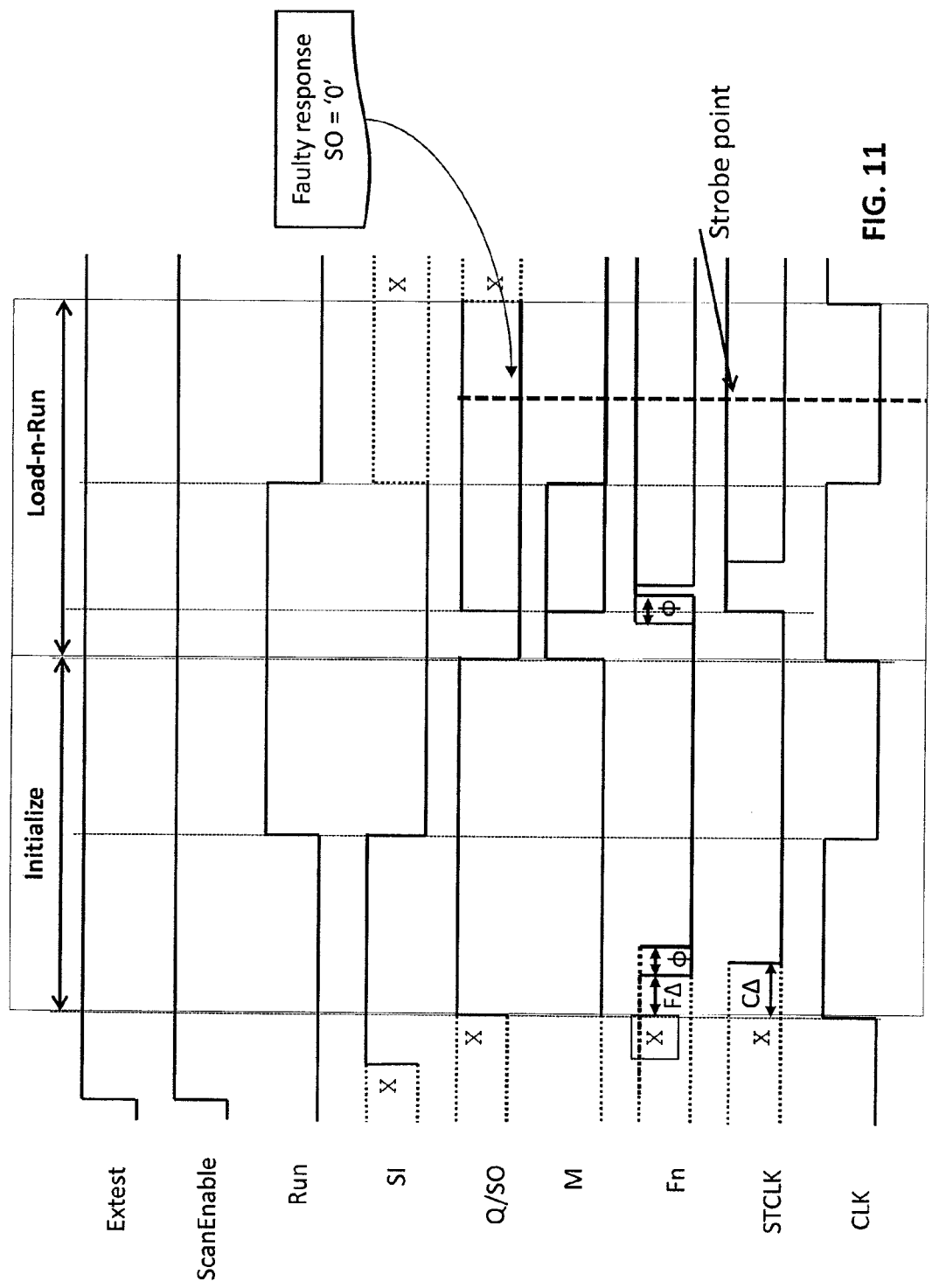
FIG. 11 is a timing diagram of the embodiment of FIG. 9 in faulty operation.

A timing diagram of such fall defect testing in case of fault-free operation is illustrated in FIG. 10, while the case of a faulty operation is illustrated in FIG. 11. It can be seen that the "normal" delay at the inverter 35, which is the delay generated by the inter-die interconnect, is F$\Delta$, while the "normal" delay generated by the delay element is C$\Delta$. The delay at the delay element is selected to be larger than the "normal" delay to be expected from the inter-die interconnect (when the inter-die interconnect is fault-free). From FIG. 11 it can be seen that, in case of a faulty operation, on top of the "normal" delay F$\Delta$, the inter-die interconnect also provides a supplementary delay $\Phi$, such that the total delay F$\Delta$+$\Phi$ by the inter-die interconnect is larger than the pre-set delay C$\Delta$ of the delay element.

In some further embodiments, test circuitry is provided for testing both rise- and fall-transition defects. Again, the embodiments illustrated are for the case where a test wrapper cell 70 is already present, although the present invention is not limited to such embodiments.

Figure 12:
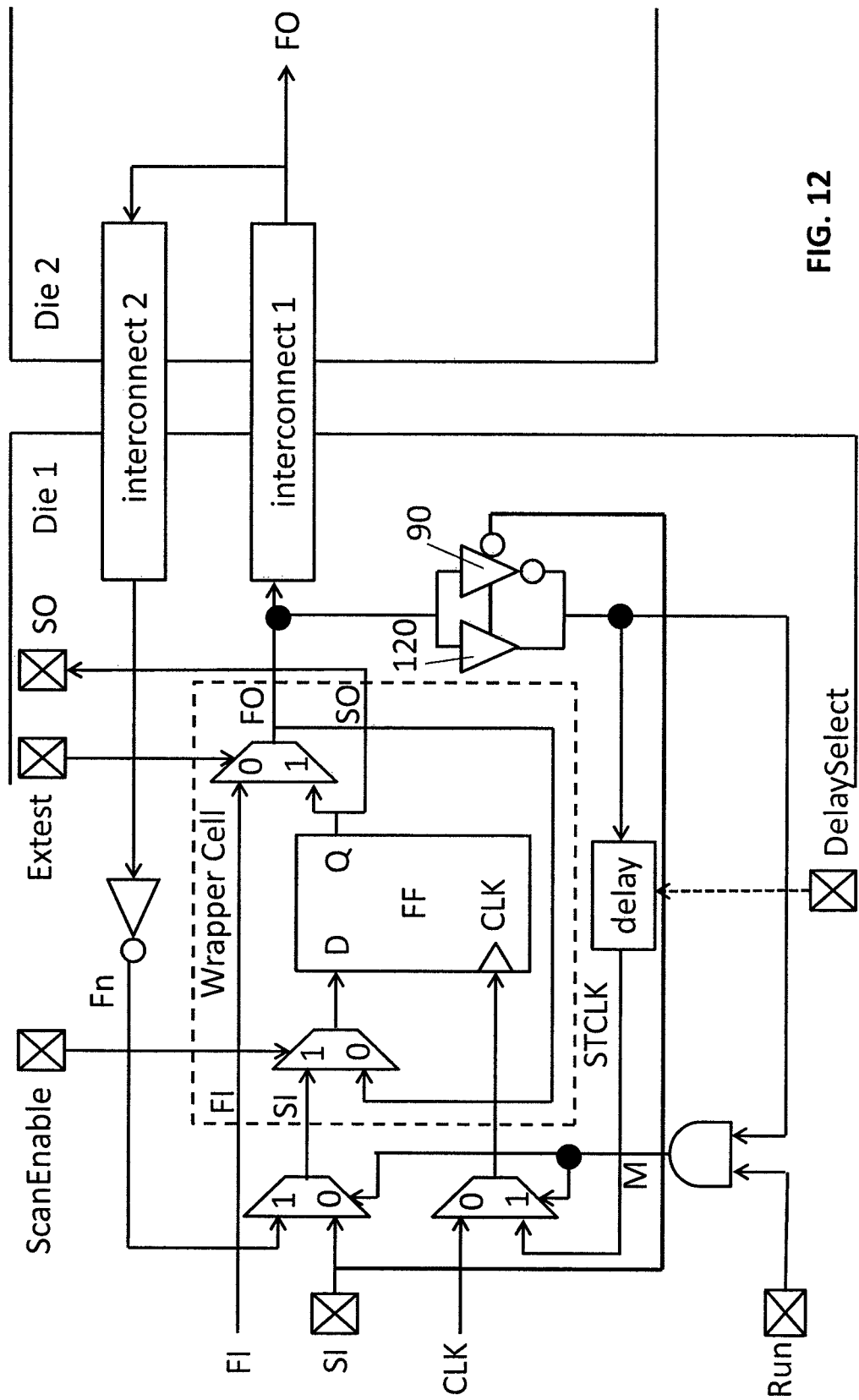
FIG. 12 illustrates a test circuitry for both rise- and fall-transition defect detection according to an embodiment.

A first embodiment is illustrated in FIG. 12. On top of the elements provided in accordance with some embodiments for being able to detect a rise-transition defect, as for example illustrate in FIG. 4, or with the test wrapper cell in FIG. 8, an inverter unit, e.g. inverter 90 is provided in the signal path before the clock generator 36 and before the AND gate 44, for inverting the signal applied to these elements with respect to the signal applied to the first interconnect interconnect 1. This allows to determine fall-transition defects. In order to also be able to determine rise-transition defects with the same detection circuitry, the functioning of this inverter unit, e.g. inverter 90, should be allowed to be switched on or off, or the inverter unit should be bypassable.

In the embodiment illustrated in FIG. 12 this is obtained by providing, in parallel to the inverter 90, a non-inverting element 120. Hence two parallel paths are provided for the signal routed from the output of the third multiplexer 43 to the input of the clock generator 36 and to the AND gate: one with an inverting element and one with a non-inverting element. The selection of which path to follow is performed by a control signal taken from the SI pin. If the test data signal at the SI pin is high, e.g. logical 1, after the initialization process, then the presence of a rise defect is determined. This high signal is applied to the non-inverting element 120 thus allowing it to function, and is applied in inverted form to the inverting element 90, thus preventing it from functioning.

Figure 13:
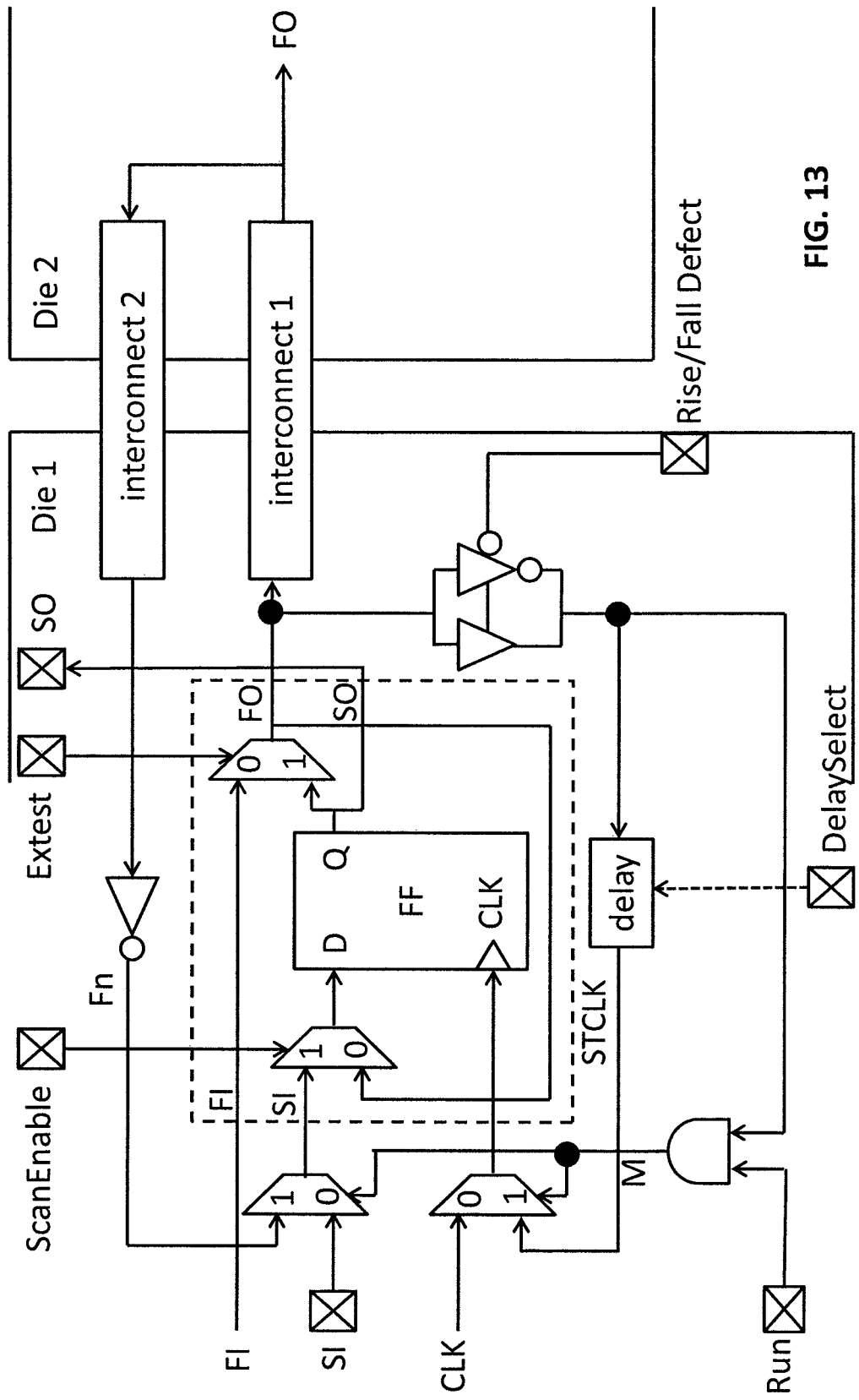
FIG. 13 illustrates an alternative test circuitry for both rise- and fall-transition defect detection according to an embodiment.

Alternatively, as illustrated in FIG. 13, rather than taking the control signal from the SI pin, a dedicated pin could be provided for applying a selection signal indicating whether a rise-transition defect or a fall-transition defect is to be determined.

Figure 14:
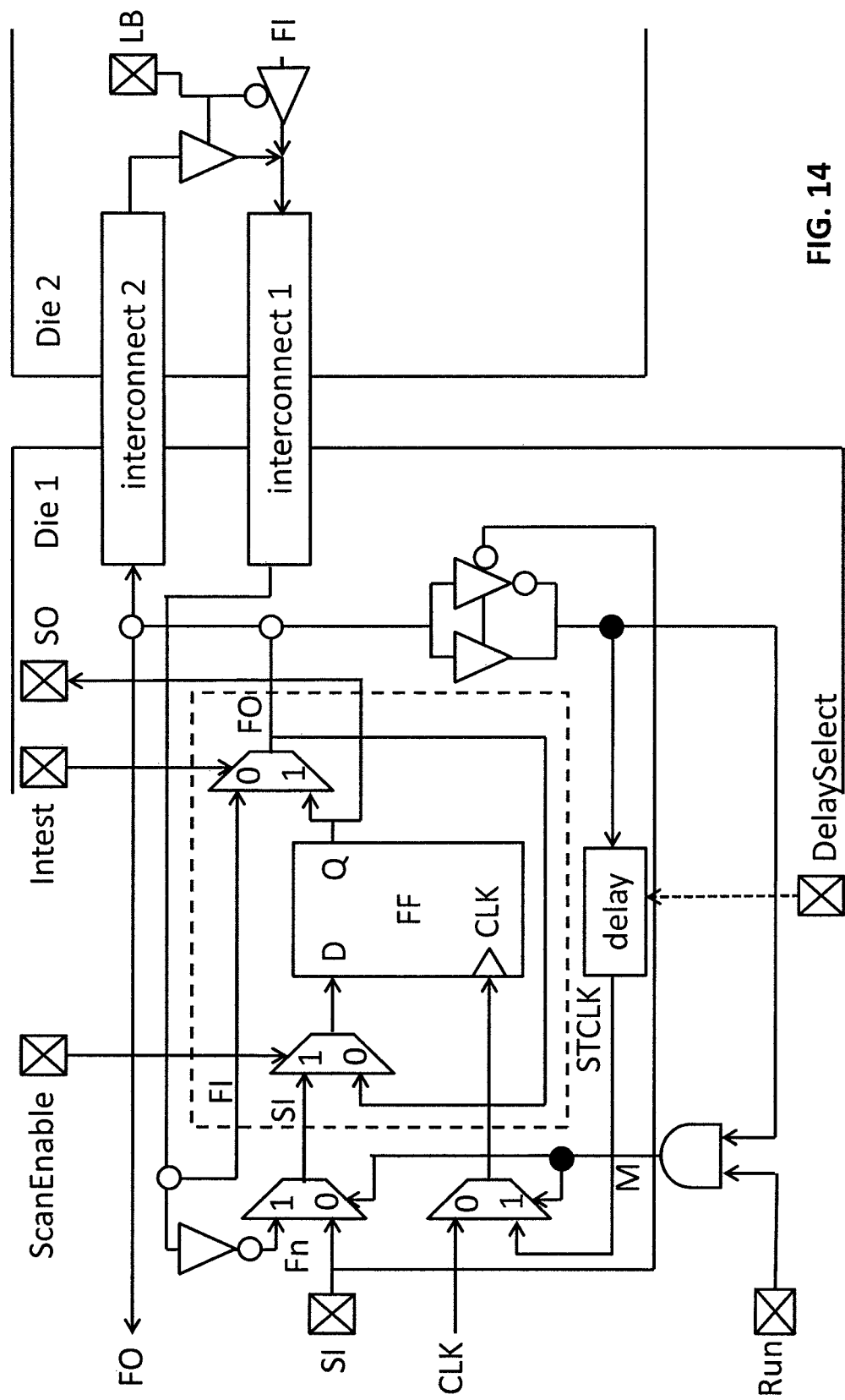
FIG. 14 illustrates yet another alternative test circuitry for both rise- and fall-transition defect detection according to an embodiment.

In previously disclosed embodiments, the detector circuit was placed at the sending side of the interconnect-under-test, indicated S-STDD in some of the drawings. In alternative embodiments, as for example illustrated in FIG. 14, the functional data input may be provided to come from the second die Die2, while the test circuitry for determining rise- and/or fall-transition defects may be provided in the first die Die 1. Such embodiments are indicated R-STDD in some of the drawings. The same concept applies, but the implementation details of the detector circuit change slightly, and that is what accounts for the differences between S-STDD and R-STDD.

In some embodiments, the first interconnect interconnect 1 is an existing functional interconnect, the one to be tested for delay defects. The further interconnect interconnect 2 may be a dedicated interconnect, provided specifically for testing purposes, as illustrated in FIG. 15 for different embodiments, or another functional interconnect, which is present in the circuit for use during normal functioning thereof, but which during testing of delay defects is re-used for testing purposes, as illustrated in FIG. 16 for different embodiments.

Figure 15A:
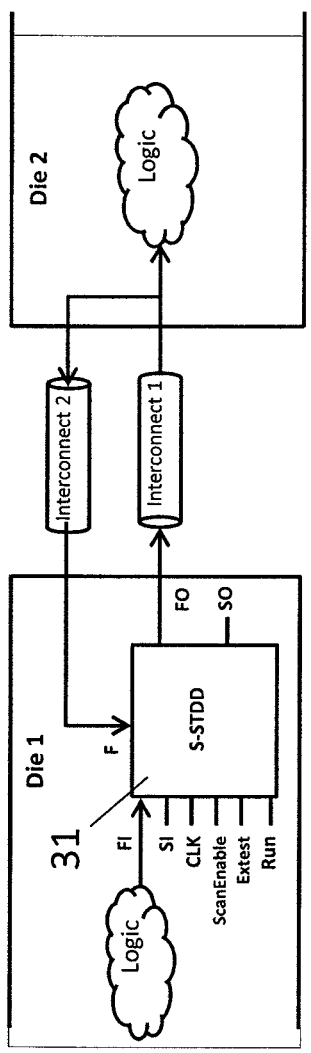
FIGS. 15(a)-15(c) illustrates a plurality of stacked dies with functional inter-die interconnects and dedicated interconnects for forming the feedback loop of the test circuitry according to some embodiments. Together, the embodiments illustrated in FIGS. 15a-15c show that the invention is independent from the intended functional signal direction of the interconnect-under-test and from the relative location of the test circuitry according to some embodiments.
Figure 15B:
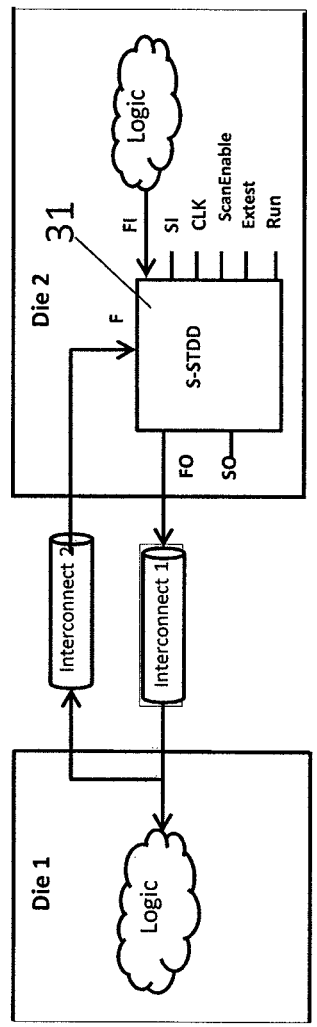
Figure 15C:
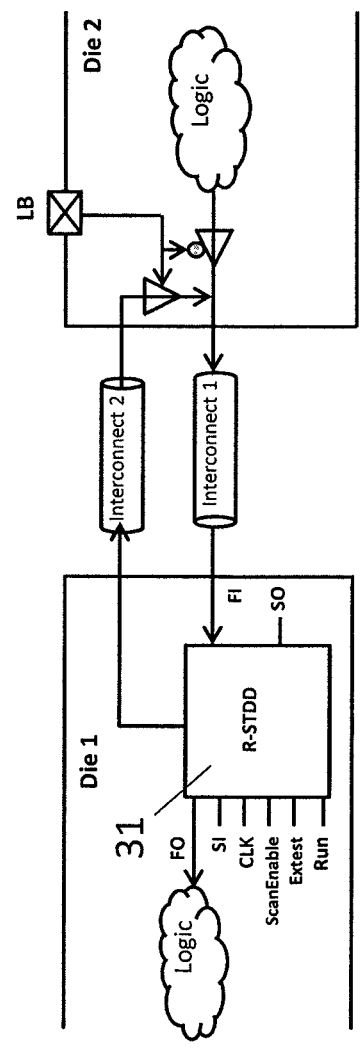

The first and the second drawing of FIG. 15 are basically the same thing, but where the test circuitry for delay testing is provided in the first or the second die, which are a bottom and a top die in a stack (or a lower and a higher located die).

In all three subfigures of FIG. 15, the following holds:
Die 1 is the lower/bottom die, Die 2 is the higher/top die. This holds for the embodiment of FIG. 15 but is, however, not intended to be limiting for the present invention.

Interconnect 1 is a functional interconnect, i.e., an interconnect that was part of the functional, mission-mode of the IC design, which is to be tested for delay defects.

Interconnect 2 is a test-only interconnect, i.e., not part of the functional, mission-mode design, but only added for the purpose of testing.

In FIG. 15(*a*), Interconnect 1 is part of a functional signal path from Die 1 to Die 2. The test circuitry 31 according to some embodiments is part of Die 1 (as described above).

FIG. 15(*b*) shows an alternative embodiment, in which Interconnect 1 is part of a functional signal path from Die 2 to Die 1, and where the test circuitry 31 according to some embodiments is part of Die 2.

FIG. 15(*c*) shows yet another alternative embodiment, in which Interconnect 1 is part of a functional signal path from Die 2 to Die 1, but where the test circuitry 31 according to some embodiments is part of Die 1. The test circuitry 31 here is a Receiving STDD (R-STDD), as opposed to a Sending STDD (S-STDD) in FIG. 15(*a*) and FIG. 15(*b*).

Together, FIG. 15(*a-c*) illustrate that the embodiments are independent from the direction of the Interconnect-Under-Test and the relative location of the test circuitry according to some embodiments.

FIG. 16 shows that it is not necessary to pair each functional to-be-tested interconnect with an additional test-only interconnect, which would double the amount of interconnects between Dies 1 and 2 and hence might be expensive. Instead, it is possible to pair two already existing functional interconnects into a feedback loop. This avoids, reduces and possibly eliminates the need for dedicated test-only interconnects. In both sub-figures of FIG. 16, Interconnects 1 and 2 are both already existing, functional, to-be-tested interconnects.

In FIG. 16(*a*), the functional circuitry in Dies 1 and 2 is using Interconnects 1 and 2 in opposite direction, as illustrated by the arrows. In test mode, the feedback loop through Interconnects 1 and 2 is reusing these interconnects in the same direction as they are intended to be used functionally. Reusing a functional interconnect for test purposes requires a controllable switch that multiplexes the test signal onto the functional path. In the example of FIG. 16(*a*), the detector circuit 31 is in Die 1 and controls Interconnect 1. In addition, a switch 160 is shown in Die 2, which multiplexes the test signal onto the functional path of Interconnect 2; this switch may for example be implemented as a multiplexer and controlled by an appropriate control signal LB.

In FIG. 16(b), the functional circuitry in Dies 1 and 2 is using Interconnects 1 and 2 in the same direction; in this example going from Die 1 to Die 2, as illustrated by the arrow. The test mode is reusing these interconnects. In order to create a feedback loop, it is required that the two interconnects carry signals in opposite direction. In order to accomplish that, in this example, Interconnect 2 is used in test mode in a direction opposite to its functional direction. The interconnect itself is direction-less, but the circuitry around the interconnect defines its direction. Hence, tri-stateable drivers need to be implemented in either die to make Interconnect 2 change directions from functional to test mode. In the example in FIG. 16(b), this direction reconfiguration is controlled by the pseudo-static control signal LB.

Figure 17:
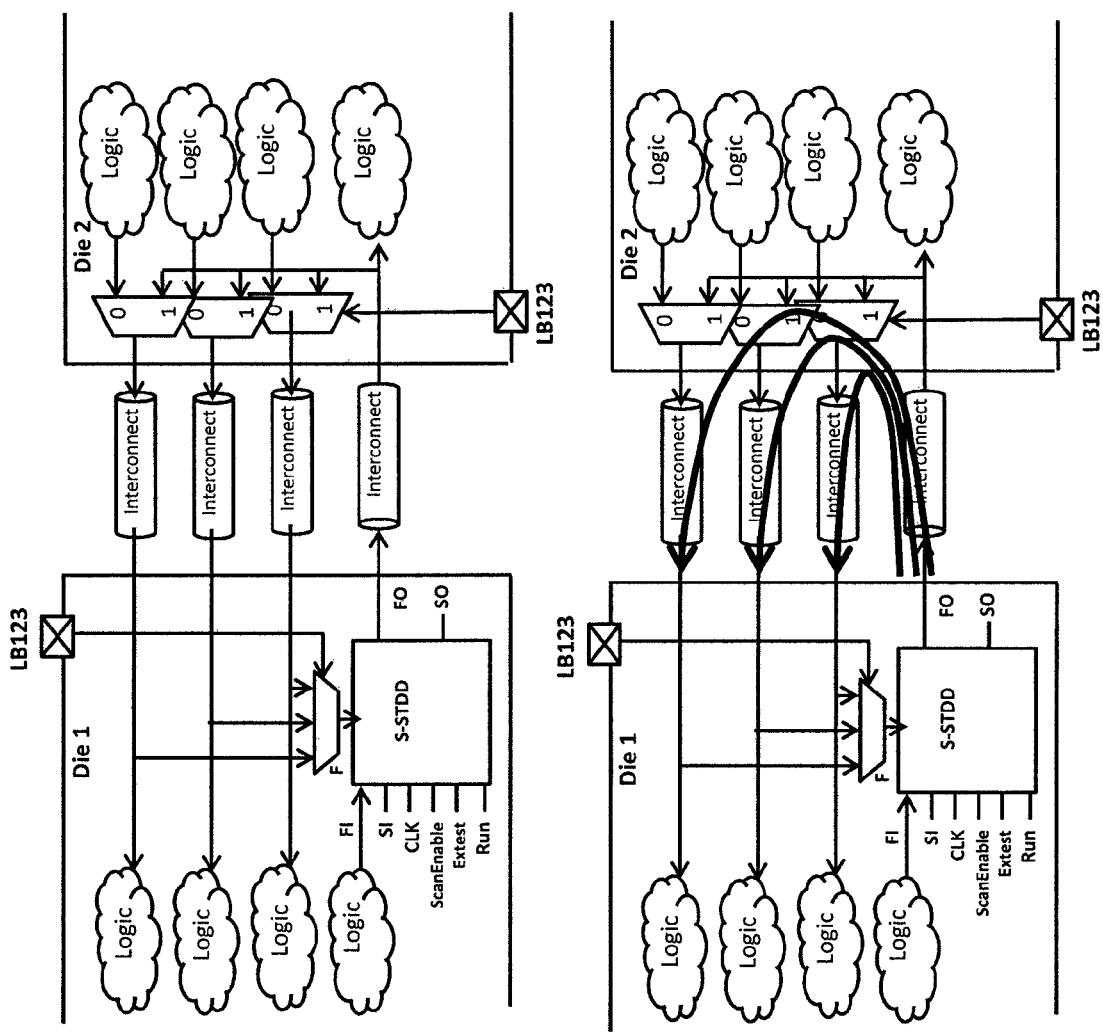
FIG. 17 illustrates an embodiment, where one test circuit may serve multiple loopbacks.

In yet some alternative embodiments, as illustrated in FIG. 17 for different embodiments, one test circuit S-STDD may serve multiple loopbacks. Hereto, multiplexers may be added as required.

FIG. 17 illustrates 3 loopbacks being created one at a time, each loopback being tested one after the other by correctly controlling the multiplexer providing the input to the test circuitry S-STDD. The test circuitry is shared over the multiple interconnects. Such implementation has the advantage that it is not required to provide a test circuit per pair of inter-die interconnects for testing them, hence saving substrate space hence reducing costs. However, at the other hand the test time becomes longer, as testing of a plurality of interconnects is performed in a serial mode. Hence there is a trade-off between test time and the number of test modules to be provided.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

What is claimed is:

1. A test circuitry configured to test for transition delay defects in a first inter-die interconnect electrically connecting a first die and a second die to one another, the test circuitry comprising:
   an input port configured to receive a test data value;
   a data storage element having a data input and a clock input and configured to temporarily store the test data value;
   a second inter-die interconnect configured to be electrically connected to the first inter-die interconnect so as to form a feedback loop through which the test data value is looped, the feedback loop configured such that the test data value is sent from the data storage element to the second die through the first inter-die interconnect, and sent back from the second die to the data storage element through the second inter-die interconnect;
   a data conditioner configured to condition the test data value sent back from the second die to the first die so as to make it distinguishable from the stored test data value;
   a clock pulse generator configured to generate a delayed clock pulse;
   a selection logic comprising a first multiplexer configured to provide alternative inputs comprising an externally applied test data signal and a loopback test data that has travelled through the feedback loop to the data input of the data storage element;
   the selection logic further comprising a second multiplexer configured to provide alternative inputs comprising an externally generated clock signal and the delayed clock pulse to the clock input of the data storage element,
   wherein the selection logic is configured to provide the delayed clock pulse when the test data value is looped, and
   wherein the test circuitry is configured such that a determination of whether or not the transition delay defects are present is made at least in part by comparing relative arrival times at the storage element of the delayed clock pulse and the loopback test data; and
   a readout unit for reading out a test data value stored in the data storage element.

2. The circuitry of claim 1, wherein the clock pulse generator comprises a delay element configured to delay an equivalent of the test data value sent through the feedback loop, for generating the delayed clock pulse.

3. The circuitry of claim 1, wherein the clock pulse generator is arranged such that the delayed clock pulse has a delay longer than an expected functional delay of the test data signal when travelling through the feedback loop.

4. The circuitry of claim 1, wherein the clock pulse generator is implemented with a delay element having a fixed delay duration.

5. The circuitry of claim 1, wherein the clock pulse generator is implemented with a delay element having a programmable delay.

6. The circuitry of claim 1, wherein the test circuitry is combined with an existing wrapper cell for testing purposes.

7. The circuitry of claim 1, wherein the test circuitry is configured to determine one or both of a rise-transition delay defect and a fall-transition delay defect.

8. The circuitry of claim 1, wherein the data storage element comprises a flip-flop.

9. The circuitry of claim 1, wherein the second inter-die interconnect comprises a functional interconnect.

10. The circuitry of claim 1, wherein the second inter-die interconnect is a test-only interconnect.

11. The test circuitry of claim 1, wherein the test circuitry is configured such that when the first inter-die interconnect has the transition delay defects, the looped test data is received by the data storage element prior to receiving the delayed clock pulse, while when the first inter-die interconnect does not have the transition delay defects, the delayed clock pulse is received by the data storage element prior to receiving the looped test data.

12. The test circuitry of claim 1, wherein the data conditioner comprises an inverter configured to invert the test data value sent back from the second die.

13. A structure comprising a first die and a second die electrically connected to one another by at least a first inter-die interconnect, wherein at least one of the first die and the second die comprises:
   a first electrical circuit; and
   a test circuitry configured to test for transition delay defects in the first inter-die interconnect, wherein the test circuitry comprises:
      an input port for receiving a test data value;

a data storage element having a data input and a clock input and configured to temporarily store the test data value;

a second inter-die interconnect configured to be electrically connected to the first inter-die interconnect so as to form a feedback loop through which the test data value is looped, the feedback loop configured such that the test data value is sent from the data storage element to the second die through the first inter-die interconnect, and sent back from the second die to the to the data storage element through the second inter-die interconnect;

a data conditioner configured to condition the test data value sent back from the second die to the first die so as to make it distinguishable from the stored test data value;

a clock pulse generator configured to generate a delayed clock pulse;

a selection logic comprising a first multiplexer configured to provide alternative inputs comprising an externally applied test data signal and a loopback test data that has travelled through the feedback loop to the data input of the data storage element;

the selection logic further comprising a second multiplexer configured to provide alternative inputs comprising an externally generated clock signal and the delayed clock pulse to the clock input of the data storage element, wherein the selection logic is configured to provide the delayed clock pulse when the test data value is looped, and wherein the test circuitry is configured such that a determination of whether or not the transition delay defects are present is made at least in part by comparing relative arrival times at the storage element of the delayed clock pulse and the loopback test data; and a readout unit for reading out a test data value stored in the data storage element.

14. The structure of claim 13, wherein at least the first die and the second die are stacked on top of one another in a 3D chip configuration.

15. The structure of claim 13, wherein at least one of the first inter-die interconnect and the second inter-die interconnect connects the first die and the second die via a third die such as an interposer.

16. The test circuitry of claim 13, wherein the test circuitry is configured such that when the first inter-die interconnect has the transition delay defects, the looped test data is received by the data storage element prior to receiving the delayed clock pulse, while when the first inter-die interconnect does not have the transition delay defects, the delayed clock pulse is received by the data storage element prior to receiving the looped test data.

17. A method of testing for transition delay defects in a first inter-die interconnect electrically connecting a first die and a second die to one another, the method comprising:

receiving a test data value;

temporarily storing the test data value in a data storage element having a data input and a clock input;

transmitting the test data value from the first die over a feedback loop comprising the first inter-die interconnect and a second inter-die interconnect, the feedback loop configured such that the test data value is sent from the data storage element to the second die through the first inter-die interconnect, and sent back from the second die to the data storage element through the second inter-die interconnect;

conditioning the test data value sent back from the second die to the first die so that it is distinguishable from the test data value sent from the first die to the second die, and feeding the conditioned test data value to the data storage element;

providing alternative inputs comprising an externally applied test data signal and a loopback test data that has travelled through the feedback loop to the data input of the data storage element;

further providing alternative inputs comprising an externally generated clock signal and the delayed clock pulse to the clock input of the data storage element, wherein the selection logic is configured to provide the delayed clock pulse when the test data value is looped; and determining whether or not the transition delay defects are present at least in part by comparing relative arrival times at the storage element of the delayed clock pulse and the loopback test data.

* * * * *

UNITED STATES PATENT AND TRADEMARK OFFICE
CERTIFICATE OF CORRECTION

PATENT NO. : 9,568,536 B2  Page 1 of 1
APPLICATION NO. : 14/059366
DATED : February 14, 2017
INVENTOR(S) : Sandeep Kumar Goel et al.

It is certified that error appears in the above-identified patent and that said Letters Patent is hereby corrected as shown below:

In Column 8 at Line 24, Change "DIE1" to --DIE1,--.

In Column 19 at Line 11 (approx.), In Claim 13, change "to the to the" to --to the--.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*